United States Patent
Kobayashi et al.

(10) Patent No.: US 11,373,894 B2
(45) Date of Patent: Jun. 28, 2022

(54) SUBSTRATE PROCESSING APPARATUS AND SUBSTRATE HOLDING APPARATUS

(71) Applicant: EBARA CORPORATION, Tokyo (JP)

(72) Inventors: Kenichi Kobayashi, Tokyo (JP); Tetsuji Togawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 602 days.

(21) Appl. No.: 16/381,507

(22) Filed: Apr. 11, 2019

(65) Prior Publication Data

US 2019/0318954 A1    Oct. 17, 2019

(30) Foreign Application Priority Data

Apr. 16, 2018    (JP) .............................. JP2018-078563

(51) Int. Cl.
| | |
|---|---|
| *B24B 5/00* | (2006.01) |
| *H01L 21/687* | (2006.01) |
| *B08B 1/00* | (2006.01) |
| *H01L 21/683* | (2006.01) |
| *B24B 37/30* | (2012.01) |

(52) U.S. Cl.
CPC ........ *H01L 21/68721* (2013.01); *B08B 1/005* (2013.01); *B24B 37/30* (2013.01); *H01L 21/6838* (2013.01); *H01L 21/68742* (2013.01)

(58) Field of Classification Search
CPC ........... H01L 21/68721; H01L 21/6838; H01L 21/68742; B24B 37/30
USPC ............................... 451/398, 313, 41, 44, 66
See application file for complete search history.

(56) References Cited

U.S. PATENT DOCUMENTS

| | | | | |
|---|---|---|---|---|
| 2003/0092261 A1* | 5/2003 | Kondo | ................ | H01L 21/2885 438/638 |
| 2006/0094343 A1* | 5/2006 | Sato | ........................ | B24B 9/065 451/313 |
| 2009/0117828 A1* | 5/2009 | Hongo | .................... | B24B 37/02 451/6 |
| 2011/0048469 A1 | 3/2011 | Ogata et al. | | |

(Continued)

FOREIGN PATENT DOCUMENTS

| | | |
|---|---|---|
| EP | 2762274 A2 | 8/2014 |
| JP | H06-273919 A | 9/1994 |
| JP | H08-117701 A | 5/1996 |

(Continued)

OTHER PUBLICATIONS

European Patent Application No. 19168579.1; Extended Search Report; dated Feb. 7, 2020; 6 pages.

*Primary Examiner* — Joseph J Hail
*Assistant Examiner* — Shantese L McDonald
(74) *Attorney, Agent, or Firm* — BakerHostetler

(57) ABSTRACT

A substrate processing apparatus which can remove foreign matters attached to the entire upper surface of a substrate such as a wafer is disclosed. The substrate processing apparatus includes: a substrate holding apparatus; and a processing head configured to scrub an upper surface of a substrate. The substrate holding apparatus includes: a substrate holder configured to hold the substrate; and a substrate rotating mechanism configured to rotate the substrate held by the substrate holder. The substrate holder is disposed below the upper surface of the substrate so as not to project above the upper surface of the substrate in a state where the substrate is held by the substrate holder.

19 Claims, 20 Drawing Sheets

(56) References Cited

U.S. PATENT DOCUMENTS

2013/0213437 A1\* 8/2013 Ishii ................. H01L 21/67051
                                                                                134/6
2014/0187126 A1\* 7/2014 Nakanishi ......... H01L 21/02057
                                                                                451/44

FOREIGN PATENT DOCUMENTS

| JP | H08-148453 A | 6/1996 |
| JP | 2007-258274 A | 10/2007 |
| JP | 2014-150178 A | 8/2014 |

\* cited by examiner

SUBSTRATE PROCESSING APPARATUS AND SUBSTRATE HOLDING APPARATUS

CROSS REFERENCE TO RELATED APPLICATION

This document claims priority to Japanese Patent Application Number 2018-078563 filed Apr. 16, 2018, the entire contents of which are hereby incorporated by reference.

BACKGROUND

In recent years, various devices including memory circuits, logic circuits, and image sensors (e.g., complimentary metal-oxide-semiconductor (CMOS) sensors) have become more and more highly integrated. In the processes of fabricating these devices, foreign matters, such as fine particles and dusts, may be attached to the devices. The foreign matters attached to the devices could be a cause of a short circuit between interconnects and a malfunction of the circuit. Therefore, in order to increase reliability of the devices, it is necessary to clean a wafer on which the devices are fabricated so as to remove the foreign matters from the wafer.

The foreign matters, such as fine particles and dusts, may also be attached to a back surface of the wafer. The foreign matters on the back surface of the wafer may cause the wafer to be separated from a stage reference surface of an exposure apparatus and/or may cause the wafer surface to tilt with respect to the stage reference surface, resulting in a patterning shift or a focal length error. In order to prevent such problems, it is necessary to remove the foreign matters from an upper surface (a front surface or the back surface) of the wafer as well.

SUMMARY OF THE INVENTION

However, in a conventional method, for example, a method using one scrubbing process, there is a case that it is difficult to remove the foreign matters from the entire upper surface (the front surface or the back surface) of the wafer.

According to embodiments, there are provided a substrate processing apparatus and a substrate holding apparatus which can remove the foreign matters attached to the entire upper surface of a substrate such as a wafer.

Embodiments, which will be described below, relate to a substrate processing apparatus for processing a substrate such as a wafer and a substrate holding apparatus for holding the substrate.

In an aspect, there is a provided a substrate processing apparatus comprising: a substrate holding apparatus; and a processing head configured to scrub an upper surface of a substrate, the substrate holding apparatus comprises: a substrate holder configured to hold the substrate; and a substrate rotating mechanism configured to rotate the substrate held by the substrate holder, wherein the substrate holder is disposed below the upper surface of the substrate so as not to project above the upper surface of the substrate in a state where the substrate is held by the substrate holder.

In a preferred aspect, the substrate holder comprises a holding chuck configured to hold an outermost circumferential surface of the substrate, and the holding chuck comprises a plurality of chuck members arranged at equal intervals around a rotation center of the substrate rotating mechanism.

In a preferred aspect, the substrate holding apparatus comprises a cleaning mechanism configured to clean a contact surface of the holding chuck which can make contact with the substrate.

In a preferred aspect, the substrate holder comprises: a pusher configured to move the holding chuck in a direction toward the substrate; and a releaser configured to move the holding chuck in a direction away from the substrate.

In a preferred aspect, the substrate holding apparatus comprises a substrate suction mechanism configured to suck and hold the substrate.

In a preferred aspect, the substrate holding apparatus comprises a substrate push-up mechanism configured to push up the substrate above the substrate holder.

In a preferred aspect, the substrate rotating mechanism comprises: a holder support member configured to support the substrate holder; and a rotating device coupled to the holder support member, the rotating device being configured to rotate the holder support member about a central axis of the substrate.

In another aspect, there is a provided a substrate holding apparatus comprising: a substrate holder configured to hold a substrate; and a substrate rotating mechanism configured to rotate the substrate held by the substrate holder, wherein the substrate holder is disposed below an upper surface of the substrate so as not to project above the upper surface of the substrate in a state where the substrate is held by the substrate holder.

In a preferred aspect, the substrate holder comprises a holding chuck configured to hold an outermost circumferential surface of the substrate, and the holding chuck comprises a plurality of chuck members arranged at equal intervals around a rotation center of the substrate rotating mechanism.

In a preferred aspect, the substrate holding apparatus comprises a cleaning mechanism configured to clean a contact surface of the holding chuck which can make contact with the substrate.

In a preferred aspect, the substrate holder comprises: a pusher configured to move the holding chuck in a direction toward the substrate; and a releaser configured to move the holding chuck in a direction away from the substrate.

In a preferred aspect, the substrate holding apparatus comprises a substrate suction mechanism configured to suck and hold the substrate.

In a preferred aspect, the substrate holding apparatus comprises a substrate push-up mechanism configured to push up the substrate above the substrate holder.

In a preferred aspect, the substrate rotating mechanism comprises: a holder support member configured to support the substrate holder; and a rotating device coupled to the holder support member, the rotating device being configured to rotate the holder support member about a central axis of the substrate.

The substrate holder is disposed below the upper surface of the substrate in a state where the substrate is held by the substrate holder. Therefore, the scrubber can process the entire upper surface of the substrate without contacting the substrate holder. As a result, the scrubber can remove the foreign matters attached to the entire upper surface of the substrate.

DESCRIPTION OF EMBODIMENTS

Figure 1A:
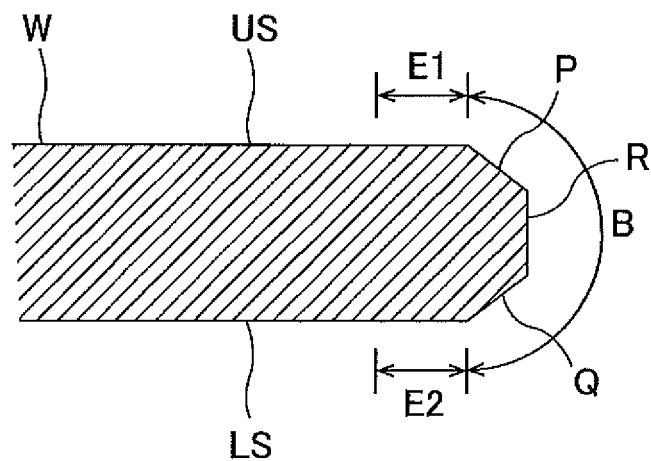
FIG. 1A and FIG. 1B are enlarged cross-sectional views each showing a peripheral portion of a wafer which is an example of a substrate.

Embodiments will be described below with reference to the drawings. Identical or corresponding structural elements are denoted by identical reference numerals and will not be described below repetitively. In a plurality of embodiments described below, structures of one embodiment, which will not be specifically described, are the same as those of another embodiment, and duplicate explanations will be omitted.

Figure 1B:
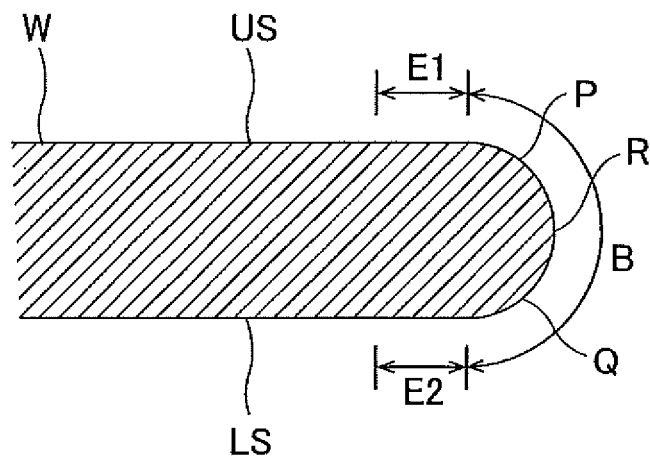

FIG. 1A and FIG. 1B are enlarged cross-sectional views each showing a peripheral portion of the wafer which is an example of the substrate. More specifically, FIG. 1A shows a cross-sectional view of a so-called straight-type wafer, and FIG. 1B shows a cross-sectional view of a so-called round-type wafer. In a wafer W shown in FIG. 1A, a bevel portion is an outermost circumferential surface of the wafer W (indicated by a symbol B) that is constituted by an upper slope (an upper bevel portion) P, a lower slope (a lower bevel portion) Q, and a side portion (an apex) R.

In the wafer W shown in FIG. 1B, the bevel portion is a portion (indicated by a symbol B) having a curved cross section and forming an outermost circumferential surface of the wafer W. More specifically, the bevel portion B is constituted by an upper slope (an upper bevel portion) P, a lower slope (a lower bevel portion) Q, and a side portion (an apex) R. The side portion R located between the upper slope P and the lower slope Q is a top portion located on the outermost side of the wafer W.

A top edge portion is a flat portion E1 located radially inwardly of the bevel portion B and located on an outermost side of an upper surface US of the wafer W. The top edge portion E1 constitutes a part of the upper surface US of the wafer W. A bottom edge portion is a flat portion E2 located opposite the edge portion and located radially inwardly of the bevel portion B. The bottom edge portion E2 is a region located on an outermost side of a lower surface LS of the wafer W and constitutes a part of the lower surface LS of the wafer W.

Figure 2:
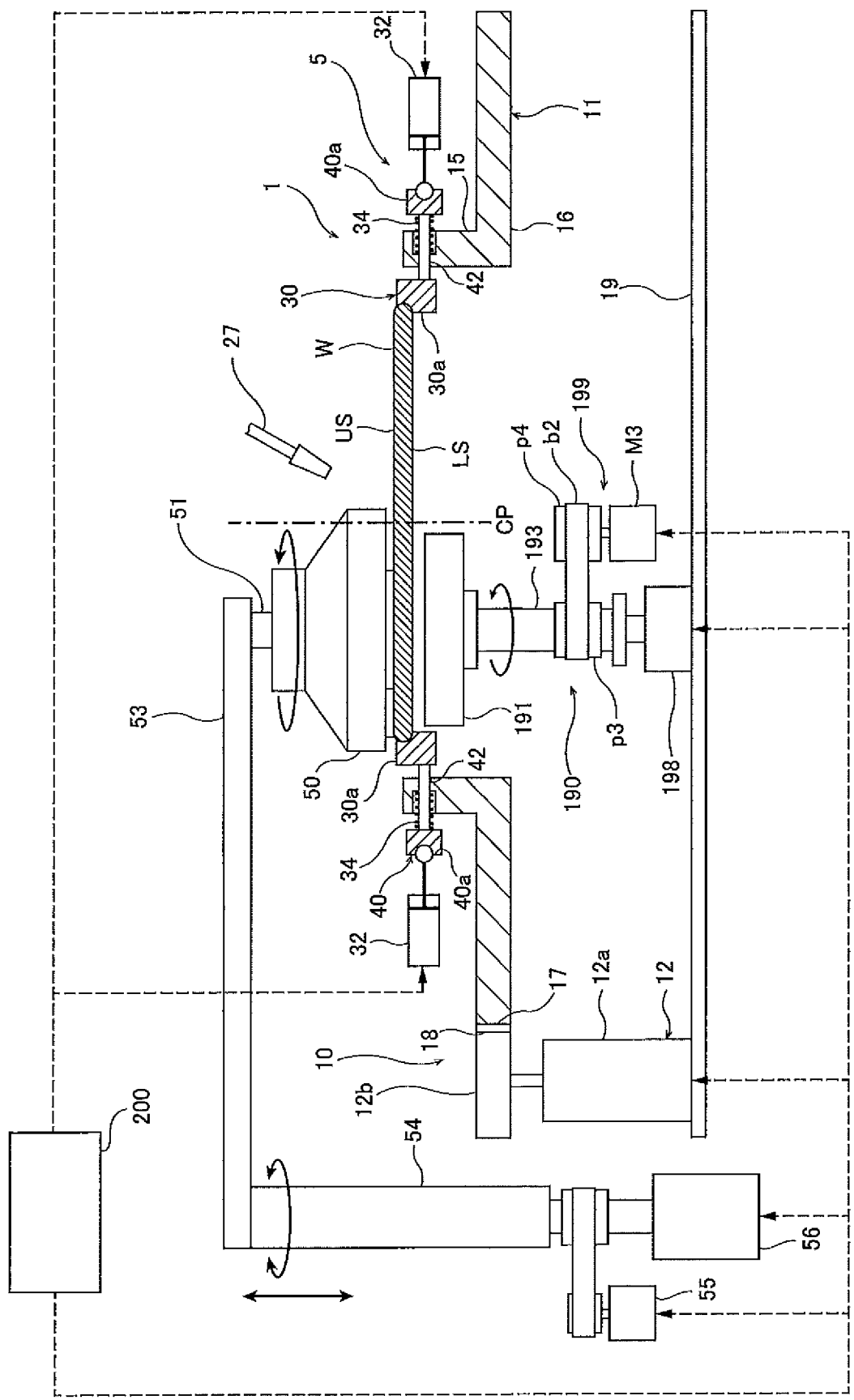
FIG. 2 is a side view showing an embodiment of a substrate processing apparatus.

FIG. 2 is a side view showing an embodiment of a substrate processing apparatus. As shown in FIG. 2, the substrate processing apparatus includes a substrate holding apparatus 1 configured to hold the wafer W which is an example of the substrate, a scrubber (or a processing head) 50 configured to scrub (or polish) the upper surface (the front surface or the back surface) of the wafer W, and a hydrostatic support mechanism 190 configured to support the lower surface (the front surface or the back surface of the wafer W) of the wafer W with a fluid pressure without contacting the wafer W.

The substrate holding apparatus 1 is disposed below the upper surface US of the wafer W and is configured to hold the wafer W and to release the held wafer W. The substrate holding apparatus 1 includes a substrate holder 5 configured to hold the outermost circumferential surface (i.e., bevel portion B) of the wafer W, and a substrate rotating mechanism 10 configured to rotate the wafer W held by the substrate holder 5 about a central axis CP of the wafer W.

The scrubber 50 is disposed at an upper side of the wafer W. The hydrostatic support mechanism 190 is disposed at a lower side of the wafer W. The scrubber 50 scrubs the upper surface US of the wafer W held by the substrate holder 5 to remove the foreign matters and scratches from the upper surface US of the wafer W. The hydrostatic support mechanism 190 is disposed in an inner space of the substrate rotating mechanism 10, more specifically in an inner space of the substrate holder 5.

The scrubber 50 is coupled to one end of a swing arm 53 through a scrubber shaft 51. The other end of the swing arm 53 is fixed to a pivot shaft 54. The swing arm 53 is coupled to a shaft rotating mechanism 55. This shaft rotating mechanism 55 is configured to rotate the pivot shaft 54 such that the scrubber 50 moves between a processing position shown in FIG. 2 and a retreat position located radially outwardly of the wafer W.

The pivot shaft 54 is further coupled to a scrubber elevating mechanism 56 which moves the scrubber 50 vertically. This scrubber elevating mechanism 56 is configured to elevate and lower the scrubber 50 through the pivot shaft 54 and the scrubber shaft 51. The scrubber 50 is lowered to contact the upper surface of the wafer W by the scrubber elevating mechanism 56. The scrubber elevating mechanism 56 may include an air cylinder or a combination of a servomotor and a ball screw.

The swing arm 53 to which the scrubber 50 is coupled, the swing shaft 54 to which the swing arm 53 is fixed, the shaft rotating mechanism 55 to which the swing shaft 54, and the scrubber elevating mechanism 56 constructs a scrubber moving mechanism. The scrubber moving mechanism may have a construction other than the above-described constructions (i.e., the swing arm 53, the swing shaft 54, the shaft rotating mechanism 55, and the scrubber elevating mechanism 56).

Figure 3:
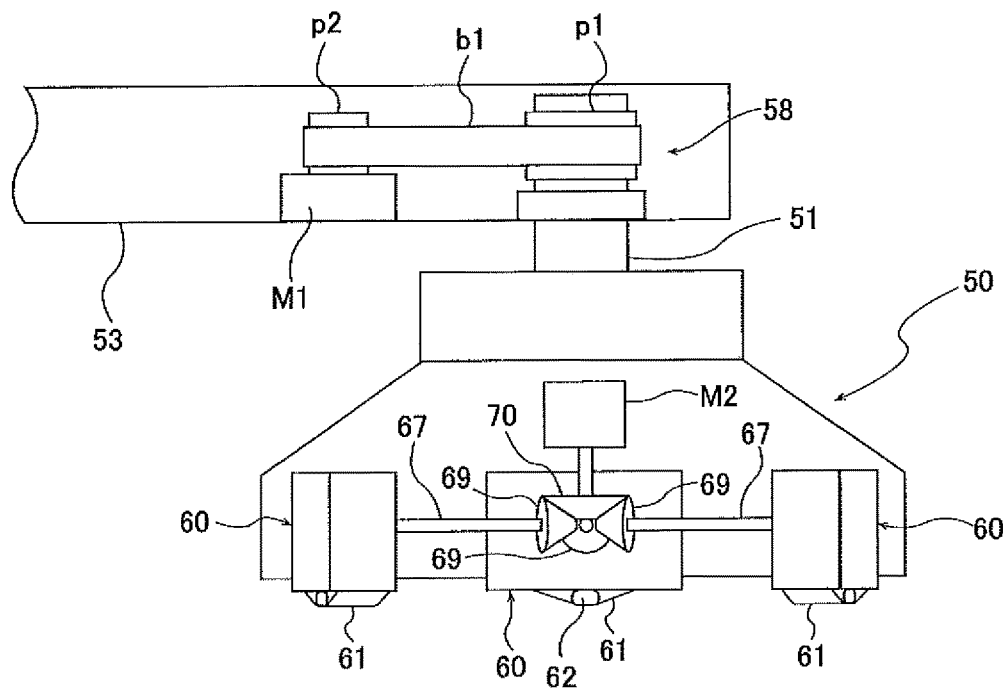
FIG. 3 is a view showing internal structures of a scrubber and a swing arm.

FIG. 3 is a view showing internal structures of the scrubber 50 and the swing arm 53. As shown in FIG. 3, a scrubber rotating mechanism 58 is provided in the swing arm 53. This scrubber rotating mechanism 58 is configured to rotate the scrubber 50 about a central axis of the scrubber 50. More specifically, the scrubber rotating mechanism 58 includes a pulley p1 fixed coaxially to the scrubber shaft 51, a motor M1 mounted to the swing arm 53, a pulley p2 fixed coaxially to a rotational shaft of the motor M1, and a belt b1 riding on the pulleys p1, p2. Rotation of the motor M1 is transmitted through the pulleys p1, p2 and the belt b1 to the scrubber shaft 51, which rotates the scrubber 50.

Figure 4:
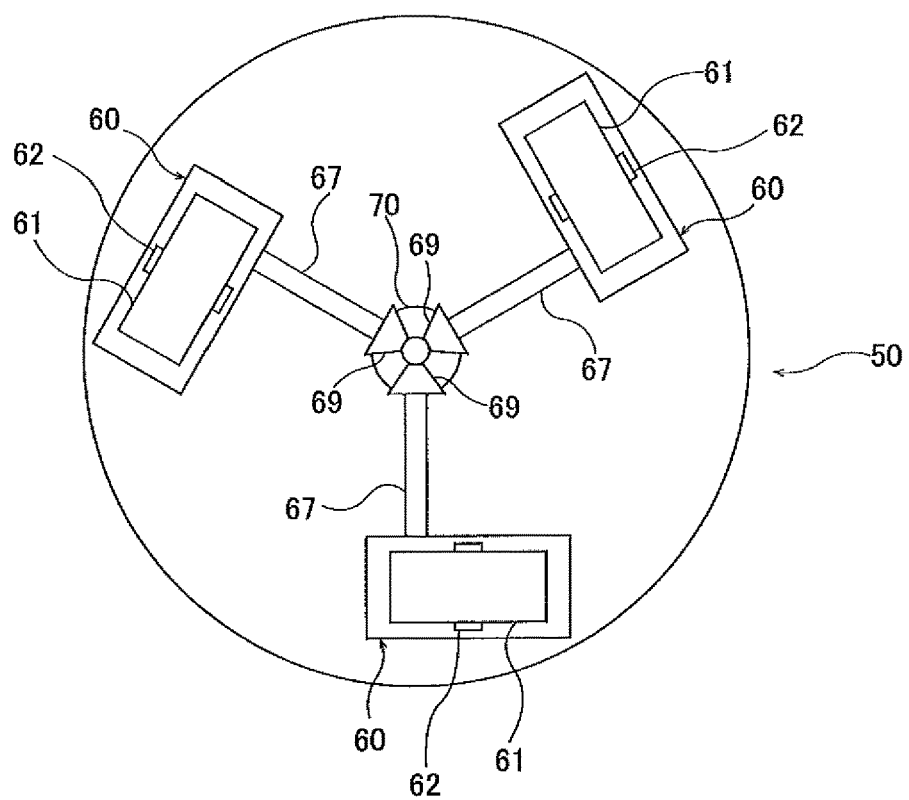
FIG. 4 is a bottom view of the scrubber.

FIG. 4 is a bottom view of the scrubber 50. The scrubber 50 has a lower surface that provides the circular scrubbing surface for scrubbing (or polishing) the upper surface of the wafer W (the front surface or the back surface of the wafer W) that is held by the substrate holder 5. The scrubber 50 has a plurality of (three in FIG. 4) tapes 61 as the scrubbing members arranged so as to face the upper surface of the wafer W. The scrubber 50 has a plurality of (three in FIG. 4) tape cartridges 60 accommodating the tapes 61 therein, respectively. The tape cartridges 60 are removably installed in the scrubber 50.

A liquid supply nozzle 27 configured to supply a processing liquid (cleaning liquid or polishing liquid) on the upper surface of the wafer W is disposed above the wafer W (see FIG. 2). This liquid supply nozzle 27 is connected to a liquid supply source (not shown) and is configured to supply the processing liquid onto the upper surface of the wafer W through the liquid supply nozzle 27. Although not shown in the drawings, a two-fluid jet nozzle may be disposed above the wafer W. If necessary, a fluid mixture of a liquid and a compressed gas is supplied onto the upper surface of the wafer W from the two-fluid jet nozzle so as to remove fine foreign matters and debris which could not be removed by the scrubber 50.

When scrubbing the wafer W, the scrubber 50 is rotated about its central axis by the scrubber rotating mechanism 58 to rotate the tapes 61 about the central axis of the scrubber 50, so that the tapes 61 are placed in sliding contact with the upper surface of the wafer W. In this manner, the scrubbing surface of the scrubber 50 is formed by the rotating tapes 61.

Since the lower surface of the wafer W is supported by the fluid pressure, the scrubber 50 can press the tapes 61 against the upper surface of the wafer W with a large load without bending the wafer W. Material forming the upper surface of the wafer W is scraped off slightly by the sliding contact with the tapes 61. Therefore, the foreign matters, attached to the wafer W, and the surface scratches of the wafer W can be removed.

Figure 5:
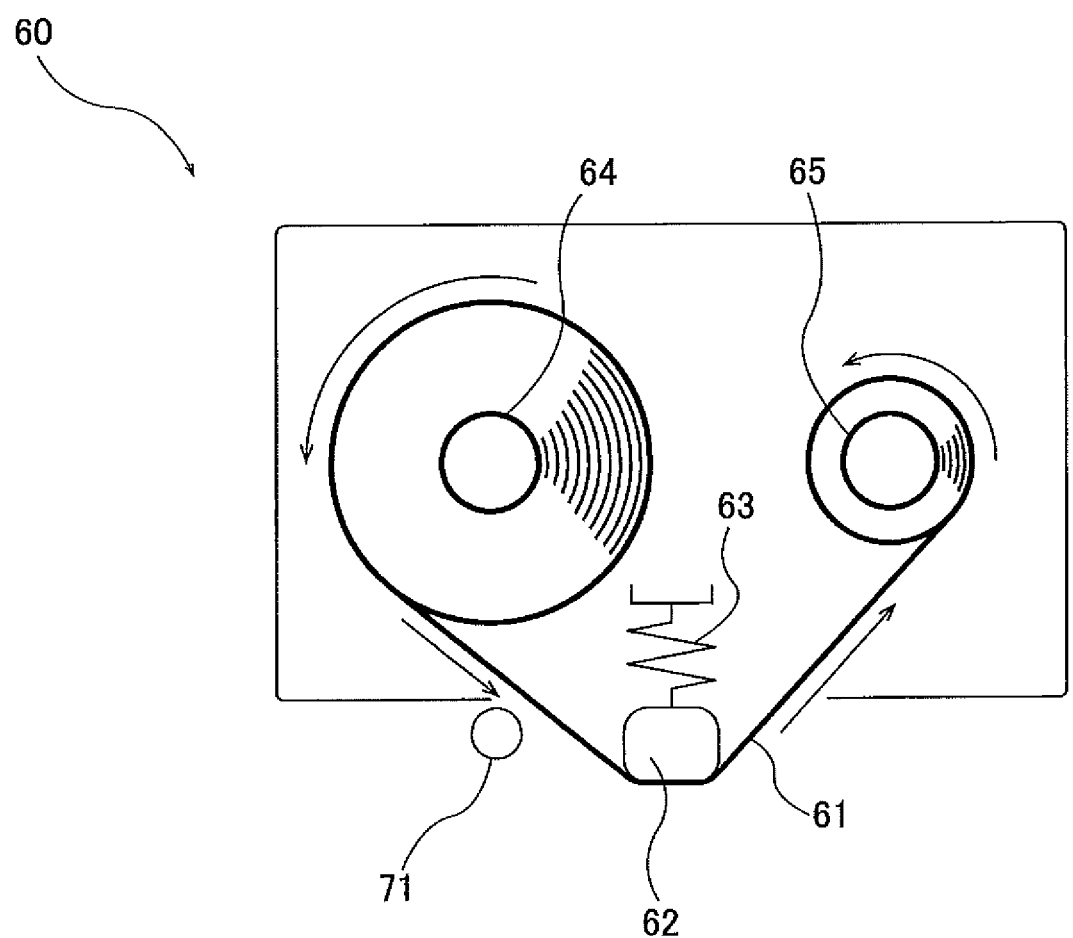
FIG. 5 is a cross-sectional view of a tape cartridge disposed in the scrubber.

FIG. 5 is a cross-sectional view of the tape cartridge 60 disposed in the scrubber 50. As shown in FIG. 5, the tape cartridge 60 includes the tape 61, a pressing member 62 configured to press the tape 61 against the wafer W, a biasing mechanism 63 configured to bias the pressing member 62 toward the wafer W, a tape feeding reel 64 configured to feed the tape 61, and a tape take-up reel 65 configured to take up the tape 61 that has been used in a scrubbing process. The tape 61 is advanced from the tape feeding reel 64 to the tape take-up reel 65 via the pressing member 62. The pressing members 62 of the respective tape cartridges 60 extend in the radial direction of the scrubber 50 and are arranged at equal intervals in a circumferential direction of the scrubber 50. Therefore, the tapes 61 have respective wafer contact surfaces (i.e., substrate contact surfaces) extending in the radial direction of the scrubber 50. In FIG. 5, a spring is used as the biasing mechanism 63.

The tape take-up reels 65 of the tape cartridges 60 are coupled to one ends of tape take-up shafts 67 as shown in FIGS. 3 and 4. Bevel gears 69 are secured to the other ends of the tape take-up shafts 67, respectively. These bevel gears 69, which are coupled to the tape cartridges 60, are in mesh with a bevel gear 70 which is coupled to a rotational shaft of a motor M2 arranged in the scrubber 50. With these configurations, the tape take-up reels 65 are driven by the motor M2 to take up (or collect) the tapes 61. The motor M2, the bevel gears 69 and 70, and the tape take-up shafts 67 jointly construct a tape advancing mechanism for advancing the tapes 61 from the tape feeding reels 64 to the tape take-up reels 65.

The tape 61 may be made of nonwoven fabric, woven fabric, or knitted fabric. Nonwoven fabric harder than PVA sponge may be used as the tape 61. The tape 61 made of such nonwoven fabric can remove the foreign matters on the wafer W, particularly the foreign matters stuck into the surface of the wafer W. Instead of the tape 61, a polishing tape having on its one-side surface a polishing layer containing abrasive grains may be used as the scrubbing member.

When scrubbing the wafer W, the tape 61 is advanced at a predetermined speed from the tape feeding reel 64 to the tape take-up reel 65. Therefore, a new (i.e., unused) surface of the tape 61 is brought into contact with the wafer W at all times. Each tape 61 has an end mark (not shown) near the terminal end thereof. This end mark is detected by an end-mark detection sensor 71 which is disposed in proximity to the tape 61. When the end-mark detection sensor 71 detects the end mark on the tape 61, the end-mark detection sensor 71 sends a detection signal to an operation controller (not shown). Upon receiving the detection signal, the operation controller produces a signal, such as an alarm signal, for prompting a user to replace the tape 61 with new one. Since the tape cartridges 60 are removable, they can easily be replaced with new tape cartridges 60.

The retreat position of the scrubber 50 is located radially outwardly of the substrate rotating mechanism 10, and the scrubber 50 is configured to be movable between the retreat position and the processing position. A tank (not shown) retaining a processing liquid (e.g., pure water) therein is provided in the retreat position of the scrubber 50. When the scrubber 50 is in the retreat position, the lower surface (i.e., the scrubbing surface) of the scrubber 50 is immersed into the processing liquid in the tank in order to prevent the tapes 61 from being dried. The processing liquid in the tank is replaced with fresh pure water each time the scrubber 50 performs surface processing of the wafer W, so that the tank contains clean pure water at all times.

As shown in FIG. 2, the hydrostatic support mechanism 190 includes a support stage 191 adjacent to the lower surface of the wafer W, a support shaft 193 configured to support the support stage 191, a stage rotating mechanism 199 configured to rotate the support stage 191 through the support shaft 193.

The support shaft 193 is vertically movably supported by a linear-motion guide (ball spline). The support shaft 193 has its lower portion coupled to a stage elevating mechanism 198. This stage elevating mechanism 198 is configured to elevate the support stage 191 until a substrate support surface of the support stage 191 reaches a position in proximity to the lower surface of the wafer W. This stage rotating mechanism 199 includes a pulley p3 mounted to the support shaft 193, a motor M3, a pulley p4 fixed coaxially to a rotational shaft of the motor M3, and a belt b2 riding on the pulleys p3 and p4. This stage rotating mechanism 199 is configured to rotate the support stage 191 about the support shaft 193.

The fluid is continuously supplied from a fluid source (not shown) into the support stage 191. The fluid flows through a gap between the lower surface of the wafer W and the support stage 191. The gap is filled with the fluid, so that the wafer W is supported by the fluid pressure. The wafer W and the support stage 191 are kept out of contact with each other. Since the hydrostatic support mechanism 190 supports the wafer W via the fluid pressure without contacting the wafer W, any damage to micro devices formed on the wafer W can be prevented. The fluid that is used in the hydrostatic support mechanism 190 may comprise a liquid such as pure water which is an incompressible fluid or a gas which is a compressible fluid such as air, nitrogen, or the like.

The scrubbing surface of the scrubber 50 and the substrate support surface of the hydrostatic support mechanism 190 are disposed symmetrically with respect to the wafer W. Specifically, the scrubbing surface of the scrubber 50 and the substrate support surface of the hydrostatic support structure 190 are disposed such that the wafer W is interposed therebetween. The load exerted from the scrubber 50 on the wafer W is borne by the hydrostatic support mechanism 190 from right below the scrubber 50 (i.e., from the opposite side of the scrubber 50). Therefore, the scrubber 50 is able to apply a large load to the upper surface of the wafer W. The scrubber 50 may be arranged such that an edge portion of the scrubbing surface is located on the center of the wafer W.

Figure 6:
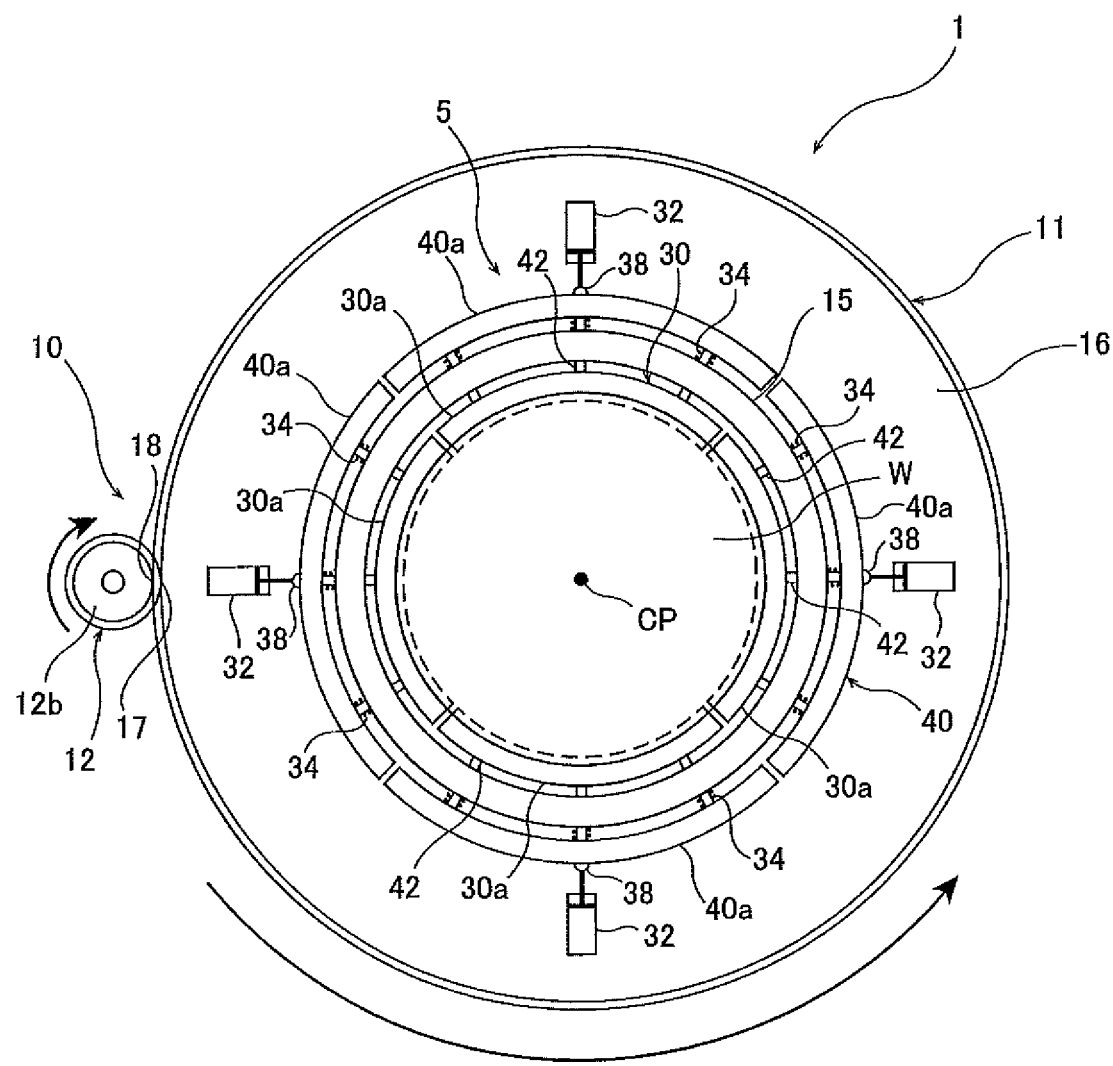
FIG. 6 is a plan view showing an embodiment of the substrate processing apparatus.

FIG. 6 is a plan view showing an embodiment of the substrate processing apparatus. In FIG. 6, the substrate holding apparatus 1, particularly the substrate holder 5 and the substrate rotating mechanism 10 are illustrated. As shown in FIG. 6, the substrate rotating mechanism 10 includes a holder support member 11 configured to support the substrate holder 5, and a rotating device 12 configured to rotate the holder support member 11 about the central axis CP of the wafer W.

The substrate rotating mechanism 10 is a mechanism for rotating the wafer W with the substrate holder 5 by driving the rotating device 12. The wafer W held by the substrate holder 5 is rotated about the central axis CP of the wafer W by the substrate rotating mechanism 10.

The holder support member 11 includes a cylindrical holder coupling portion 15 to which the substrate holder 5 is coupled, and an annular rotating base 16 to which the holder coupling portion 15 is connected. In this embodiment, the holder coupling portion 15 and the rotating base 16 are integrally molded member, while the holder coupling member 15 and the rotating base 16 may be separate members.

The cylindrical holder coupling portion 15 extends in a vertical direction, i.e., perpendicular to the upper surface (or the lower surface) of the wafer W, and is disposed concentrically with the wafer W held by the substrate holder 5. An inner diameter of the holder coupling portion 15 is larger than a diameter of the wafer W. The above-described hydrostatic support mechanism 190 is disposed in a space located radially inwardly of the holder coupling portion 15.

As shown in FIGS. 2 and 6, the rotating base 16 is fixed to a lower end of the holder coupling portion 15, and extends radially outwardly of the holder coupling portion 15. The rotating base 16 extends in a horizontal direction, i.e., parallel to the upper surface (or the lower surface) of the wafer W, and is disposed concentrically with the wafer W held by the substrate holder 5. A fixed base 19 extending horizontally is disposed below the holder support member 11. The stage elevating mechanism 198 and the rotating device 12 are mounted on the fixed base 19.

In this embodiment, the rotating device 12 as an actuator for rotating the holder support member 11 is a combination of a motor 12a and a motor pulley 12b connected to the motor 12a. For example, the motor 12a is a servomotor. The motor pulley 12b has a driving gear 17 for rotating the holder support member 11. The driving gear 17 is provided to an outer circumferential surface of the motor pulley 12b. The rotating base 16 has a driven gear 18 meshed with the driving gear 17. The driven gear 18 is provided to an outer circumferential surface of the rotating base 16. When the motor 12a is driven in a state where the driving gear 17 and the driven gear 18 are meshed with each other, the rotating base 16 is rotated with the motor pulley 12b. The holder coupling portion 15 is rotated with the rotating base 16 to rotate the wafer W held by the substrate holder 5 about the central axis CP of the wafer W through the substrate holder 5.

Figure 7:
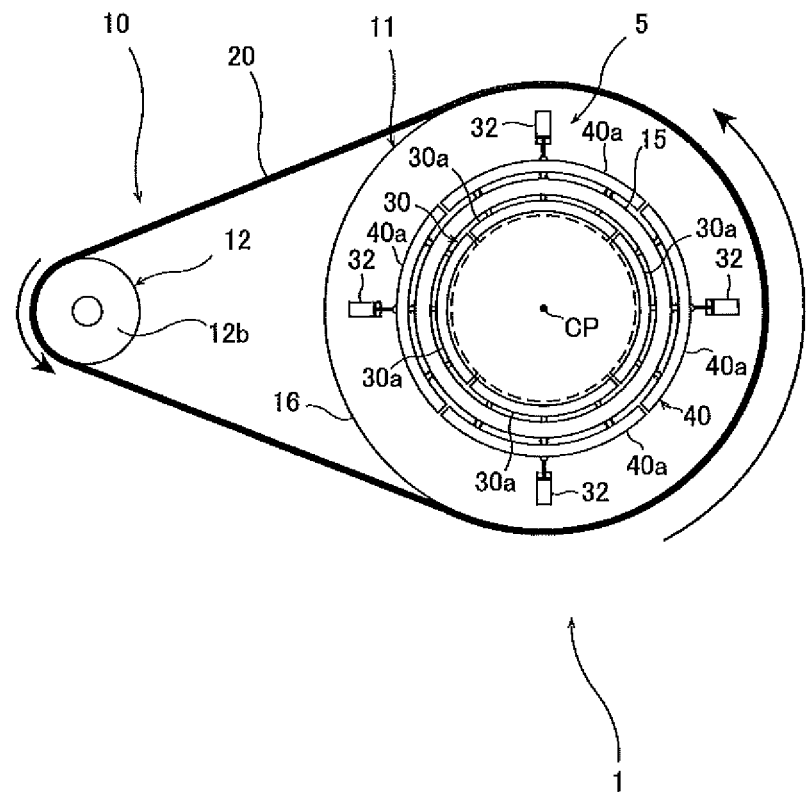
FIG. 7 is a view showing another embodiment of a rotating device.

FIG. 7 is a view showing another embodiment of the rotating device 12. As shown in FIG. 7, the rotating device 12 may be a combination of the motor 12a, the motor pulley 12b, and a timing belt 20. The timing belt 20 is stretched between the motor pulley 12b and the rotary base 16. When the motor 12a is driven, the rotating base 16 is rotated with the motor pulley 12b through the timing belt 20.

The substrate holder 5 is disposed below the upper surface US of the wafer W so as not to project above the upper surface US of the wafer W in a state where the wafer W is held by the substrate holder 5. As shown in FIGS. 2 and 6, the substrate holder 5 includes a holding chuck 30 which is brought into contact with the outermost circumferential surface (i.e., the bevel portion B) of the wafer W to hold (i.e., sandwich) the outermost circumferential surface, a pusher 32 configured to move the holding chuck 30 in a direction toward the wafer W, and a releaser 34 configured to move the holding chuck 30 in a direction away from the wafer W.

As shown in FIG. 6, the holding chuck 30 includes a plurality of (four in this embodiment) chuck members 30a arranged at equal intervals along a circumferential direction of the wafer W, in other words, around a rotation center of the substrate rotating mechanism 10. The number of chuck members 30a is not limited to this embodiment. A gap is formed between the chuck members 30a which are adjacent to each other. The chuck members 30a are not in contact with each other. Therefore, the chuck members 30a can horizontally and independently move in a direction close to the outermost circumferential surface of the wafer W and in a direction away from the outermost circumferential surface of the wafer W. When the wafer W is rotated by the substrate rotating mechanism 10, a centrifugal force acts on the wafer W. The holding chuck 30 is configured to hold the outermost circumferential surface of the wafer W so as to prevent the wafer W from jumping out from the holding chuck 30 by the centrifugal force caused by the rotation of the wafer W.

Each chuck member 30a is curved in an arc shape, and the holding chuck 30 has an annular shape by a combination of these arc-shaped chuck members 30a. The annular holding chuck 30 is disposed concentrically with the holder coupling portion 15 and the wafer W. The holding chuck 30 is disposed radially inwardly of the holder coupling portion 15.

Figure 8:
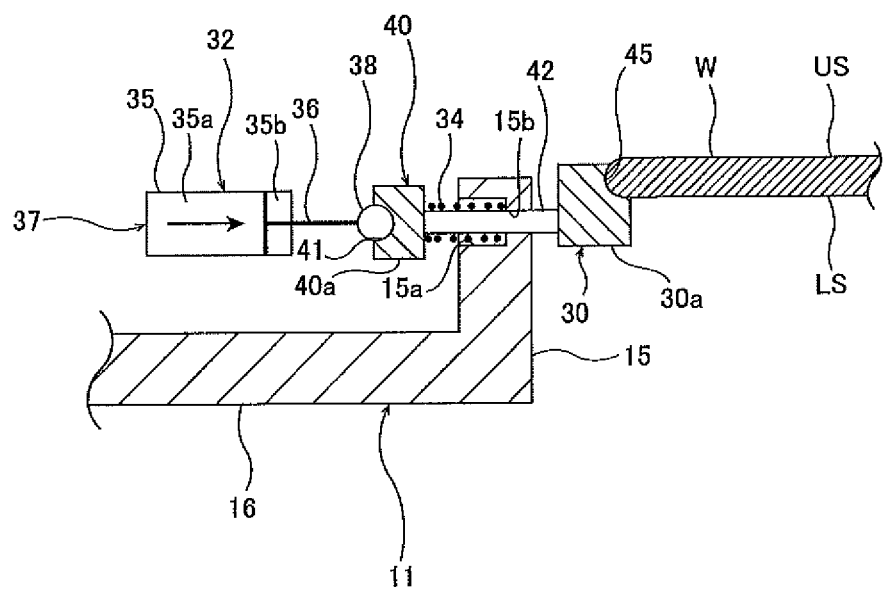
FIG. 8 is a view showing a chuck member which moves horizontally in a direction close to an outermost circumferential surface of the wafer.
Figure 9:
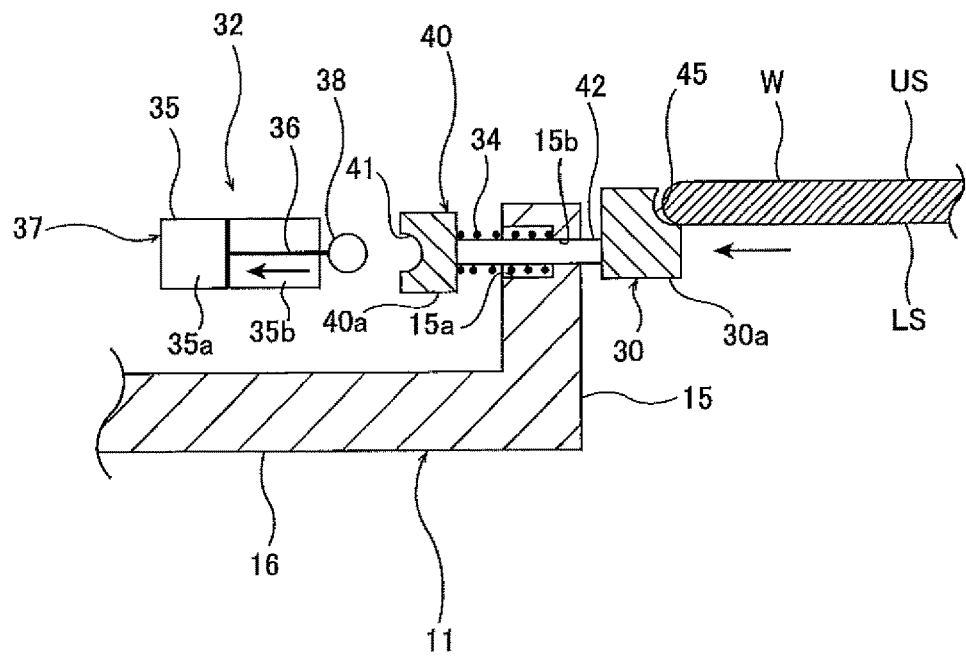
FIG. 9 is a view showing the chuck member which moves horizontally in a direction away from the outermost circumferential surface of the wafer.

FIG. 8 is a view showing the chuck member 30a which moves horizontally in the direction close to the outermost circumferential surface of the wafer W. FIG. 9 is a view showing the chuck member 30a which moves horizontally in the direction away from the outermost circumferential surface of the wafer W. When all the chuck members 30a move toward the wafer W by the pushers 32, all the chuck members 30a hold the wafer W so as to sandwich the wafer W therebetween. When all the chuck members 30a move away from the wafer W by the releasers 34, all the chuck members 30a release the holding of the wafer W.

The substrate holder 5 includes a biasing force receiving portion 40 which receives a biasing force of the pusher 32 and a biasing force of the releaser 34, and a plurality of coupling member 42 coupled to the biasing force receiving portion 40 and the holding chuck 30. The biasing force receiving portion 40 includes a plurality of (four in this embodiment) receiving members 40a. The number of receiving members 40a corresponds to the number of chuck members 30a. A gap is formed between the receiving members 40a which are adjacent to each other. The receiving members 40a are not in contact with each other. Therefore, the receiving members 40a can move independently.

Each receiving member 40a is curved in an arc shape, and the biasing force receiving portion 40 has an annular shape by a combination of these arc-shaped receiving members 40a. The annular biasing force receiving portion 40 is disposed concentrically with the holder coupling portion 15, the holding chuck 30, and the wafer W. The biasing force receiving portion 40 is disposed radially outwardly of the holder coupling portion 15. Each receiving member 40a is movable radially inwardly and radially outwardly of the biasing force receiving portion 40.

As shown in FIG. 6, each receiving member 40a and each chuck member 30a are connected to the plurality of (three in this embodiment) coupling members 42. Each receiving members 40a is coupled to each chuck member 30a through the coupling members 42. Therefore, the chuck member 30a moves horizontally in conjunction with the receiving member 40a. In this embodiment, the substrate holding apparatus 1 includes twelve coupling members 42. The twelve coupling members 42 are arranged radially at equal intervals along the circumferential direction of the wafer W.

As shown in FIGS. 8 and 9, in this embodiment, the pusher 32 is a biasing device which includes an air cylinder 37 including a cylinder body 35 and a piston rod 36, and a spherical head 38 fixed to a tip of the piston rod 36. The head 38 may be referred to as a ball head. In this embodiment, the number of pushers 32 corresponds to the number of receiving members 40a and the number of chuck members 30a. The pushers 32 (four in this embodiment) are arranged at equal intervals along the circumferential direction of the wafer W (see FIG. 6). The number of pushers 32 is not limited to this embodiment.

As shown in FIGS. 8 and 9, in this embodiment, the releaser 34 is a horizontal coil spring (biasing member) arranged in the horizontal direction. In this embodiment, twelve releasers 34 are mounted to the holder coupling portion 15. Each coupling member 42 penetrates each releaser 34. The number of releasers 34 corresponds to the number of coupling members 42.

The holder coupling portion 15 includes a mounting hole 15a through which the coupling member 42 penetrates and to which the releaser 34 is mounted, and a through hole 15b through which the coupling member 42 penetrates. The mounting hole 15a and the through hole 15b are in communication with each other and extend in the horizontal direction. The mounting hole 15a has a size that the coupling member 42 can penetrate therethrough and the releaser 34 can be mounted thereto. The through hole 15b has a size that the coupling member 42 can penetrate therethrough.

Each receiving member 40a has an arc-shaped curved groove 41 having a shape corresponding to a surface shape of the head 38. An annular recess is formed in the biasing force receiving portion 40 by a combination of the receiving members 40a and the curved grooves 41. The curved groove 41 has a size that the head 38 is loosely fitted in the curved groove 41. The biasing force receiving portion 40 can be smoothly rotated in a state where the head 38 is fitted in the curved groove 41.

An internal space of the cylinder body 35 is divided into a first pressure chamber 35a and a second pressure chamber 35b by the piston rod 36. Two gas delivery lines (not shown) are connected to the cylinder body 35. The gas delivery line is connected to a gas supply source (not shown).

As shown in FIG. 8, when the compressed gas is supplied to the first pressure chamber 35a through the gas delivery line, the piston rod 36 and the head 38 move toward the outermost circumferential surface of the wafer W. The head 38 presses the chuck member 30a against the outermost circumferential surface of the wafer W through the receiving member 40a and the coupling member 42 in a state where the head 38 is fitted in the curved groove 41 of the receiving member 40a. The chuck members 30a move toward the outermost circumferential surface of the wafer W and sandwich the wafer W therebetween. In this manner, the holding chuck 30 can hold (sandwich) the wafer W.

Figure 10:
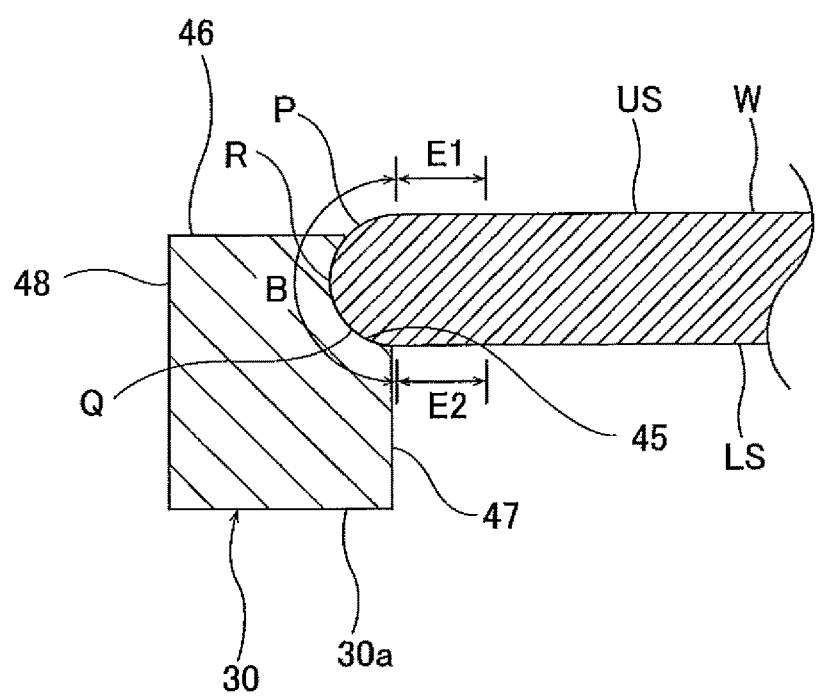
FIG. 10 is a view showing the chuck member when holding the wafer.

FIG. 10 is a view showing the chuck member 30a when holding the wafer W. As shown in FIG. 10, the chuck member 30a has a contact surface 45 that makes contact with the wafer W, and an upper surface 46 located below the upper surface US of the held wafer W. A vertical cross section of the contact surface 45 has a curved shape along a vertical cross section shape of the outermost circumferential surface of the wafer W. The contact surface 45 is connected to the upper surface 46 and an inner curved surface 47 of the chuck member 30a. The chuck member 30a has an outer curved surface 48 connected to the upper surface 46, and the outer curved surface 48 is located on the opposite side of the inner curved surface 47.

The contact surface 45 of the chuck member 30a is a contact surface that is contactable with the outermost circumferential surface of the wafer W (more specifically, the bevel portion B constituted by the lower slope Q, the side portion R, and the upper slope P). The wafer W may be held by the holding chuck 30 so that the back surface (i.e., the surface on which the device is not formed) faces upward and the front surface (i.e., the surface on which the device is formed) faces downward. In this case, the holding chuck 30 holds the wafer W so that the contact surface 45 of each chuck member 30a does not come into contact with the device.

An operation of the substrate holding apparatus 1 including the pusher 32 and the rotating device 12 is controlled by a controller 200 (see FIG. 2). The controller 200 may be the same as or different from the above-described operation controller. The controller 200 may control an overall operation of the substrate processing apparatus including the substrate holding apparatus 1. The controller 200 operates all the pushers 32. More specifically, the controller 200 operates a pressure adjustment mechanism (not shown) connected to the gas delivery lines to control supply of the compressed gas to all the air cylinder 37. The controller 200 operates the rotating device 12 to rotate the holder support member 11 in a state where the holding chuck 30 holds (sandwich) the outermost circumferential surface of the wafer W.

The pusher 32 is disposed above the rotating base 16 of the holder support member 11, and is disposed separately from the rotating base 16. Therefore, the pusher 32 is not rotated together with the rotating base 16, and continues to apply the biasing force against the biasing force receiving portion 40. The biasing force receiving portion 40 and the holding chuck 30 are rotated together with the holder support member 11 while receiving the biasing force of the pusher 32. The wafer W is rotated about the central axial CP of the wafer W while being held by the holding chuck 30 to start the scrubbing process of the wafer W.

Figure 11:
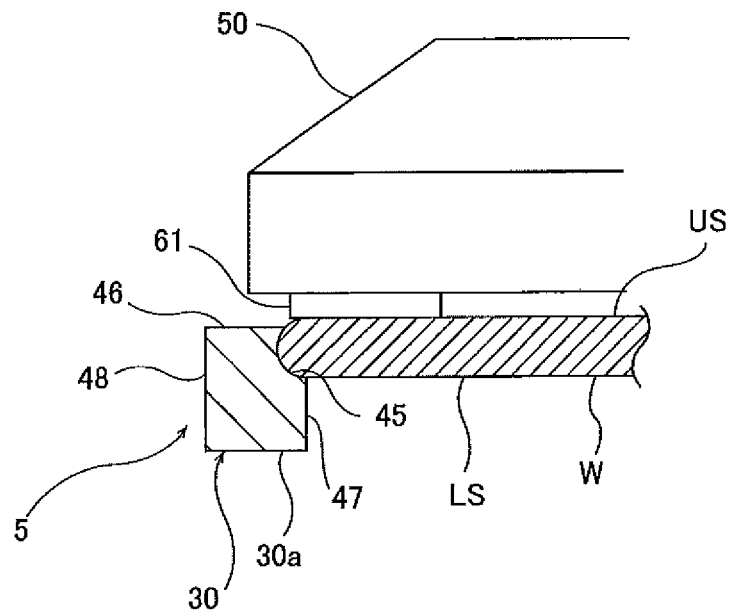
FIG. 11 is a view showing the scrubber for performing a scrubbing process the wafer.

FIG. 11 is a view showing the scrubber 50 for performing the scrubbing process the wafer W. In this embodiment, the holding chuck 30 holds the wafer W so that the entire chuck member 30a of the holding chuck 30 is located below the upper surface US of the wafer W. More specifically, the upper surface 46 of the chuck member 30a is disposed below the upper surface US of the wafer W. Therefore, the scrubber 50 can perform the scrubbing process the entire upper surface US of the wafer W including the top edge portion E1 without contacting the tape 61 of the scrubber 50 with the chuck member 30a.

A comparative example with the substrate processing apparatus according to the embodiment will be described. In the comparative example, in order to process the entire upper surface of the wafer W, it is necessary to process an outer region of the upper surface of the wafer W by holding a central region of the wafer W and to process the central region of the upper surface of the wafer W by holding the outer region of the wafer W. Therefore, two processing steps for processing the entire upper surface of the wafer W are necessary. As a result, the processing steps of the wafer W take time and labor, and a plurality of apparatuses for performing these two processing steps are necessary. According to the embodiment, the processing the entire upper surface of the wafer W is efficiently performed in one step (i.e., one substrate processing apparatus) without changing the portion holding the wafer W.

Figure 12:
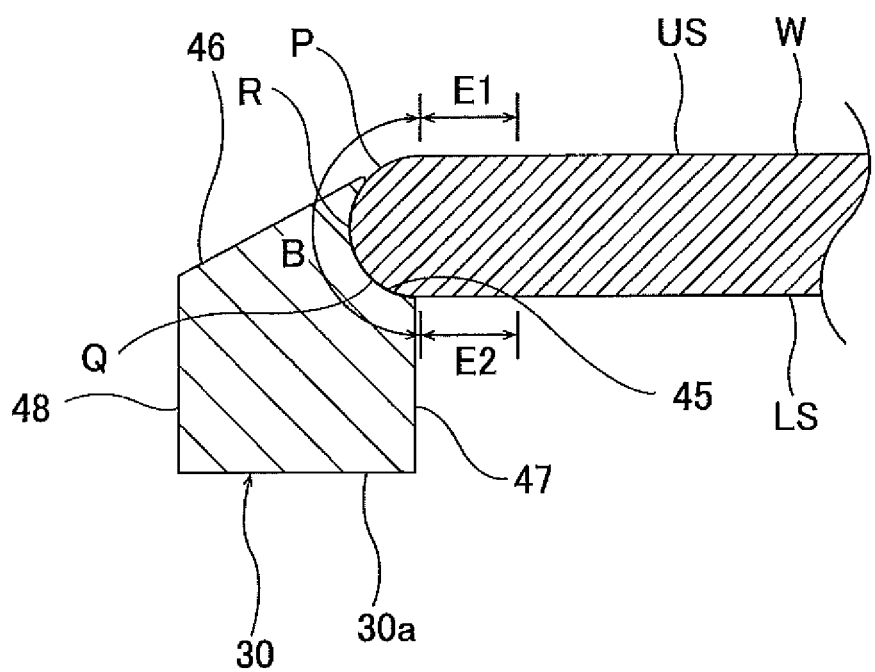
FIG. 12 is a view showing another embodiment of the chuck member.

FIG. 12 is a view showing another embodiment of the chuck member 30a. As shown in FIG. 12, the upper surface 46 of the chuck member 30a may be an inclined surface inclined obliquely downward from the inner curved surface 47 of the chuck member 30a toward the outer curved surface 48. Such a shape reliably prevents the tape 61 from coming into contact with the chuck member 30a. The liquid attached to the upper surface 46 actively flows to an outside of the wafer W, and an intruding of the liquid into the contact surface 45 is prevented.

Figure 13:
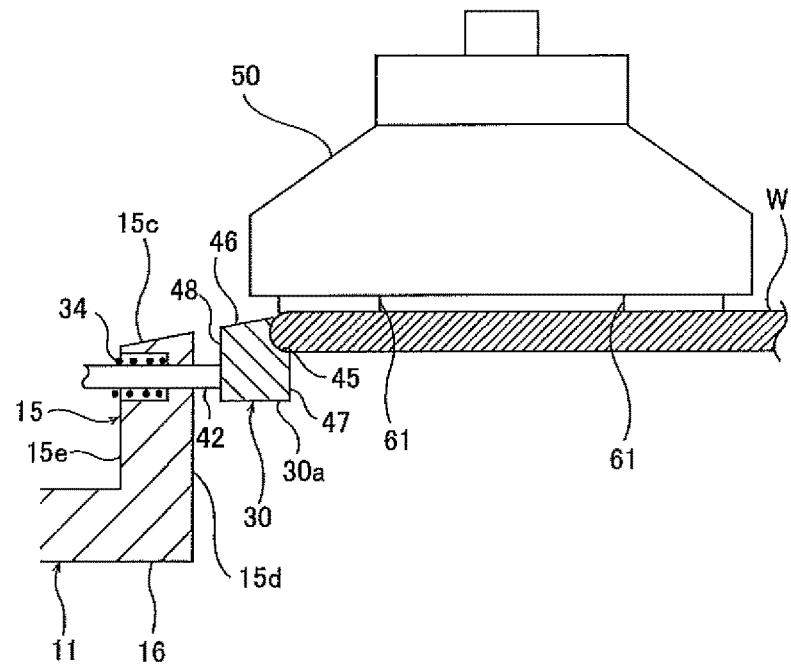
FIG. 13 is a view showing another embodiment of a holder coupling portion.

FIG. 13 is a view showing another embodiment of the holder coupling portion 15. As shown in FIG. 13, an upper surface 15c of the holder coupling portion 15 may also be an inclined surface (tapered surface) as with the upper surface 46 of the chuck member 30a. More specifically, the upper surface 15c of the holder coupling portion 15 is inclined obliquely downward from an inner circumferential surface 15d of the holder coupling portion 15 toward an outer circumferential surface 15e. In the embodiment shown in FIG. 13, an inclination angle of the upper surface 15c of the holder coupling portion 15 and an inclination angle of the upper surface 46 of the chuck member 30a are the same.

In an embodiment, a material of the chuck member 30a may be a resin having hydrophobicity or water repellency (e.g., PEEK or PTFE). With such a configuration, the chuck member 30a can repel the liquid supplied from the liquid supply nozzle 27. Therefore, an attachment of the foreign matters flowing with the liquid to the chuck member 30a is prevented. Not only the material of the chuck member 30a but also a material of the holder support member 11 (more specifically, the holder coupling portion 15) may be a resin having hydrophobicity or water repellency.

Figure 14:
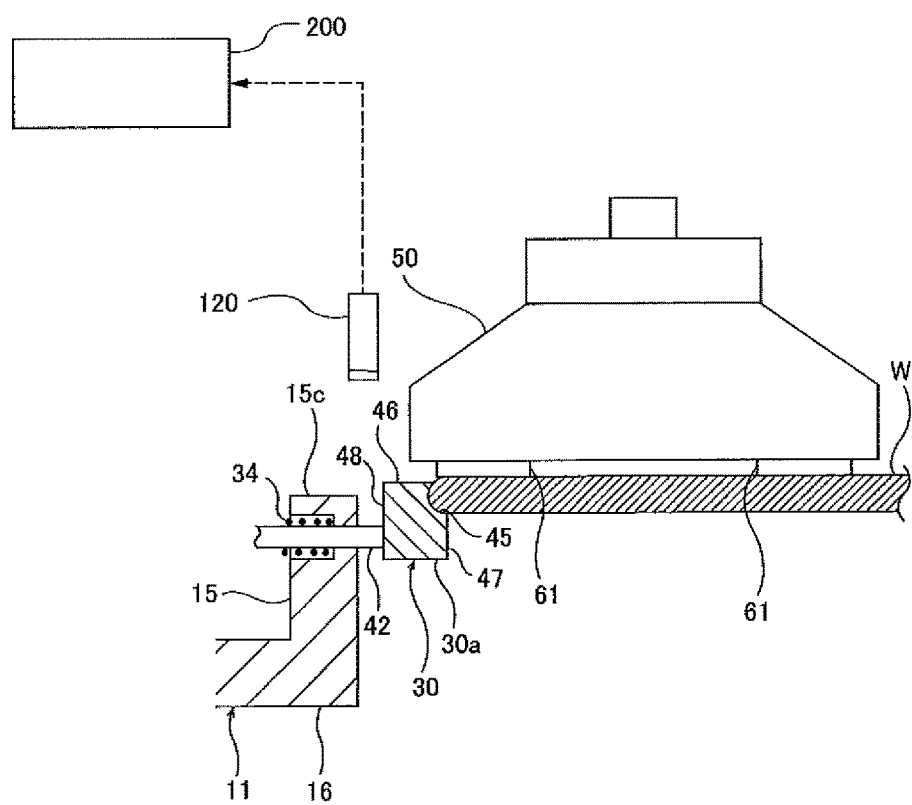
FIG. 14 is a view showing a monitoring sensor disposed above the chuck member.

FIG. 14 is a view showing a monitoring sensor 120 disposed above the chuck member 30a. As shown in FIG. 14, the monitoring sensor 120 configured to detect the upper surface 46 of the chuck member 30a may be disposed above the chuck member 30a. The monitoring sensor 120 may detect not only the upper surface 46 of the chuck member 30a but also the upper surface 15c of the holder coupling portion 15. The monitoring sensor 120 is electrically connected to the controller 200. The controller 200 monitors a condition of the upper surface 46 of the chuck member 30a based on the sensor data sent from the monitoring sensor 120.

During scrubbing of the wafer W, the scrubber 50 may scrape the upper surface 46 (and the upper surface 15c of the holder coupling portion 15) of the chuck member 30a by the tape 61 of the scrubber 50. If the chuck member 30a is worm away, the holding chuck 30 may not be able to properly hold the wafer W. As a result, the wafer W may jump out from the holding chuck 30.

Therefore, the controller 200 determines whether or not the upper surface 46 of the chuck member 30a (and the upper surface 15c of the holder coupling portion 15) is worn out based on the sensor data sent from the monitoring sensor 120 to perform an interlock operation based on this determination. The interlock operation is an operation that does not allow a start of the scrubbing process of the wafer W.

In an embodiment, the monitoring sensor 120 is a non-contact surface roughness sensor. In this case, the controller 200 monitors a surface roughness of the upper surface 46 based on the sensor data sent from the monitoring sensor 120.

In another embodiment, the monitoring sensor 120 is a distance sensor configured to measure a distance between the monitoring sensor 120 and the upper surface 46. In this case, the controller 200 monitors the distance between the monitoring sensor 120 and the upper surface 46 based on the sensor data sent from the monitoring sensor 120.

In still another embodiment, the monitoring sensor 120 is an image sensor configured to image the upper surface 46. In this case, the controller 200 processes images of the upper surface 46 based on the sensor data sent from the monitoring sensor 120 to monitor the processed images. The monitoring sensor 120 may be an optical sensor including a light emitting unit configured to irradiate light to the upper surface 46 and a light receiving unit configured to receive a reflected light.

In an embodiment, the chuck member 30a may have a two-layer structure with different types of elements (material, color). For example, an upper layer (first layer) of the chuck member 30a may be a material having block color (e.g., PEEK resin). A lower layer (second layer) of the chuck member 30a may be a material having white color (e.g., PTFE resin). In other embodiment, the lower layer of the chuck member 30a may be composed of a material that changes color by reacting to water or air. A color changing member whose color changes in response to water or air may be interposed between the upper layer and the lower layer of the chuck member 30a. With such a configuration, the monitoring sensor 120 detects an exposed lower layer, and the controller 200 can reliably determine the wear of the upper layer.

At least the upper surface 46 of the chuck member 30a may be coated with a coating agent having abrasion resistance (e.g., diamond coating). The coating agent can prolong the life of the chuck member 30a.

Before starting the scrubbing process of the wafer W or after terminating the scrubbing process of the wafer W, the controller 200 determines whether or not the numerical value indicating a degree of wear of the upper surface 46 exceeds a predetermined threshold value. When this numerical value exceeds the predetermined threshold value, the controller 200 performs the interlock operation.

After terminating the scrubbing process of the wafer W, the controller 200 stops the operation of the rotating device 12. Thereafter, as shown in FIG. 9, when the compressed gas is supplied to the second pressure chamber 35b through the gas delivery line, the piston rod 36 and the head 38 move in the direction away from the wafer W. The releaser 34 mounted to the holder coupling portion 15 separates the receiving member 40a from the holder coupling portion 15 with separating the pusher 32 from the wafer W. As a result, the chuck member 30a coupled to the receiving member 40a through the coupling member 42 moves horizontally in the direction away from the wafer W, a gap is formed between the contact surface 45 of the chuck member 30a and the outermost circumferential surface of the wafer W. In this manner, the wafer W is released from holding by the holding chuck 30.

Figure 15:
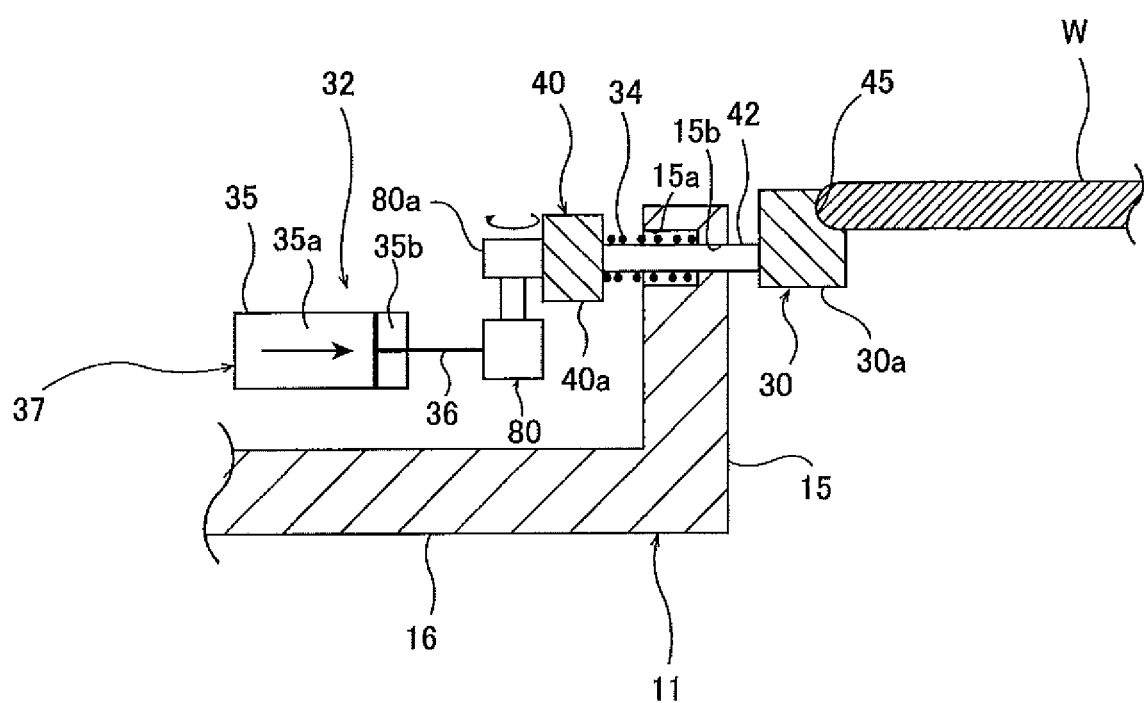
FIG. 15 is a view showing another embodiment of a pusher.

FIG. 15 is a view showing another embodiment of the pusher 32. As shown in FIG. 15, the pusher 32 may include a head 80 as a cam follower instead of the head 38. The head 80 may be referred to as a cam follower head. In the embodiment shown in FIG. 15, the piston rod 36 is connected to the head 80. A roller 80a of the head 80 is contactable with the receiving member 40a. In FIG. 15, the receiving member 40a does not have the curved groove 41 (see FIGS. 8 and 9), but may have the curved groove 41. During scrubbing the wafer W, the roller 80a of the head 80 is rotated about a central axis of the roller 80a while pressing the chuck member 30a against the outermost circumferential surface of the wafer W through the receiving member 40a and the coupling member 42.

Figure 16:
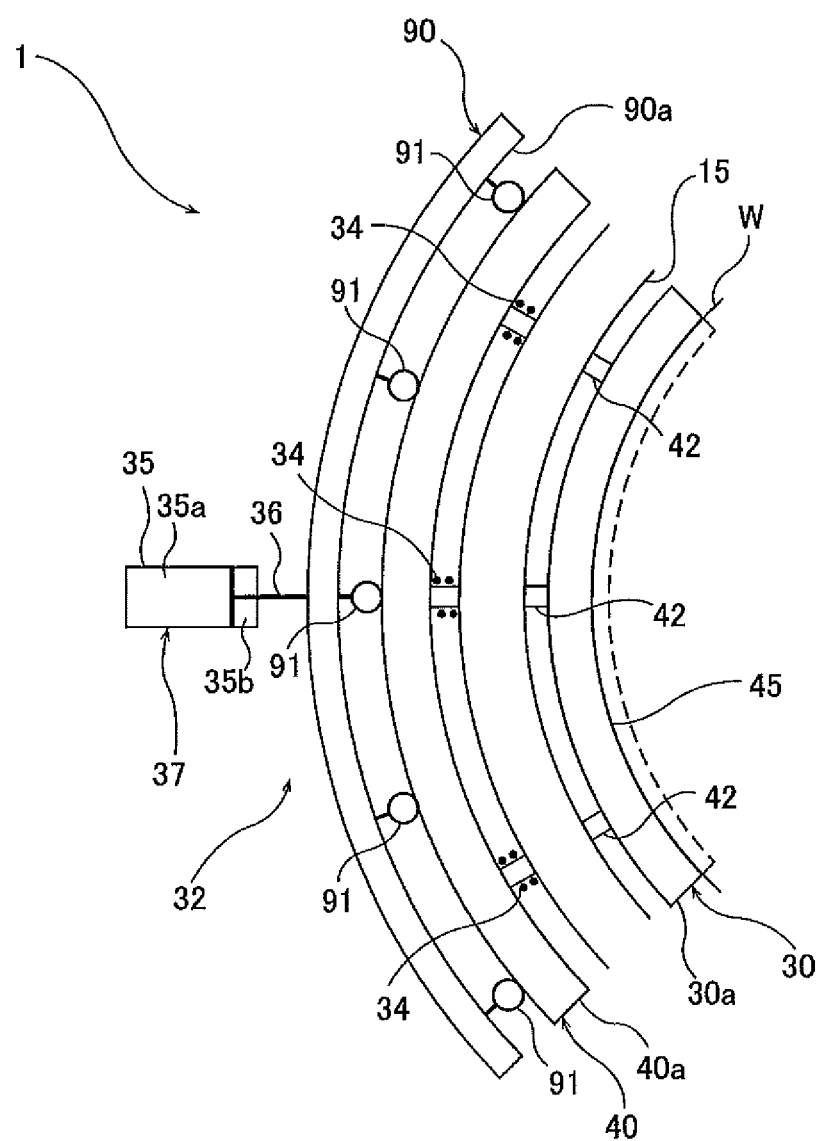
FIG. 16 is a view showing still another embodiment of the pusher.

FIG. 16 is a view showing still another embodiment of the pusher 32. As shown in FIG. 16, the pusher 32 includes the air cylinder 37 and a wide shaped head 90 fixed to the tip of the piston rod 36. The head 90 may be referred to as a wide head. The head 90 includes a plurality of pressing balls 91 extending from the inner curved surface 90a of the head 90 toward the outer curved surface of the receiving member 40a. In this embodiment, five pressing balls 91 are provided, but the number of pressing balls 91 is not limited to this embodiment.

When the compressed gas is supplied to the first pressure chamber 35a, the piston rod 36 and the head 90 move toward the receiving member 40a, and each of the pressing balls 91 presses the chuck member 30a against the outermost circumferential surface of the wafer W through the receiving member 40a and the coupling member 42.

Figure 17:
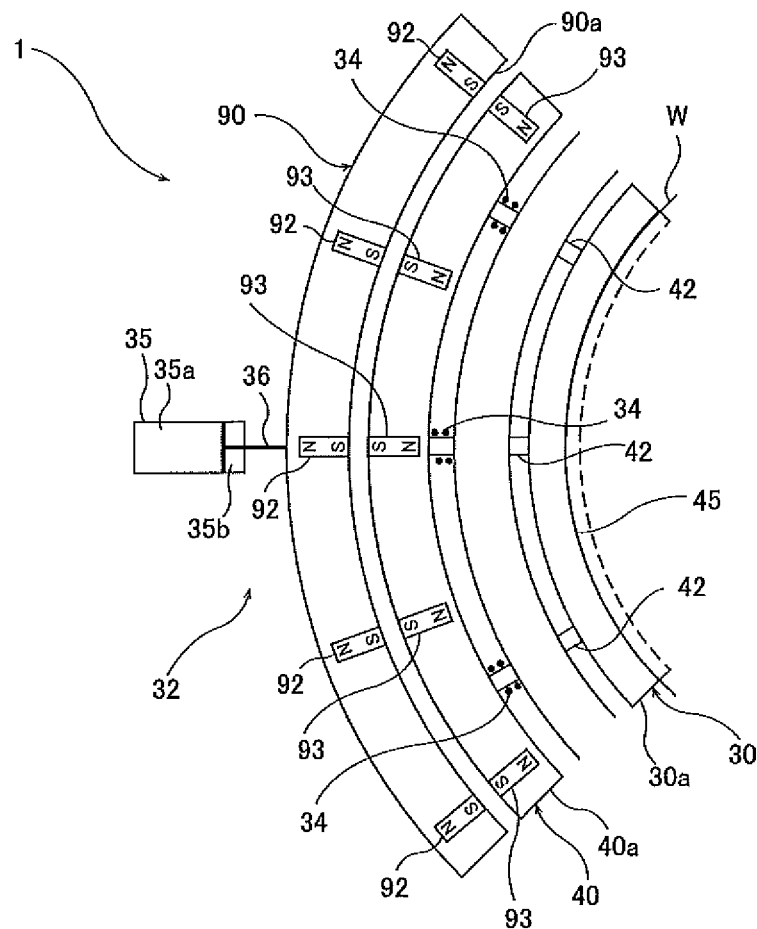
FIG. 17 is a view showing still another embodiment of the pusher.

FIG. 17 is a view showing still another embodiment of the pusher 32. As shown in FIG. 17, the head 90 may include a plurality of magnets 92 mounted inside the head 90. In this embodiment, five magnets 92 are provided, but the number of magnets 92 is not limited to this embodiment. Each of the magnets 92 is mounted so that a part of the magnet 92 is exposed from the inner curved surface 90a.

The same number of magnets 93 as that of the above-described magnet 92 is mounted inside the receiving member 40a. Each of the magnets 93 is mounted so that a part of the magnet 93 is exposed from the outer curved surface of the receiving member 40a. In an embodiment, each of the magnets 92 is a neodymium magnet, and each of the magnets 93 is a neodymium magnet.

The magnets 92 and the magnets 93 are disposed so that the same magnetic poles face each other, and a repulsive force is generated between the magnets 92 and the magnets 93. Therefore, when the compressed gas is supplied to the first pressure chamber 35a, the piston rod 36 and the head 90 move toward the receiving member 40a. The magnet 92 moves toward the magnet 93. When the magnet 92 is close to the magnet 93, the repulsive force acts between the magnet 92 and the magnet 93. The receiving member 40a moves in the direction close to the holder coupling portion 15 through the magnets 93. As a result, the chuck member 30a is pressed against the outermost circumferential surface of the wafer W through the receiving member 40a and the coupling member 42.

In the embodiment shown in FIG. 17, since the pusher 32 is not in contact with the biasing force receiving portion 40. Therefore, if the biasing force receiving portion 40 is rotated, a noise problem caused by contacting of the pusher 32 with the biasing force receiving portion 40 is not generated.

Figure 18:
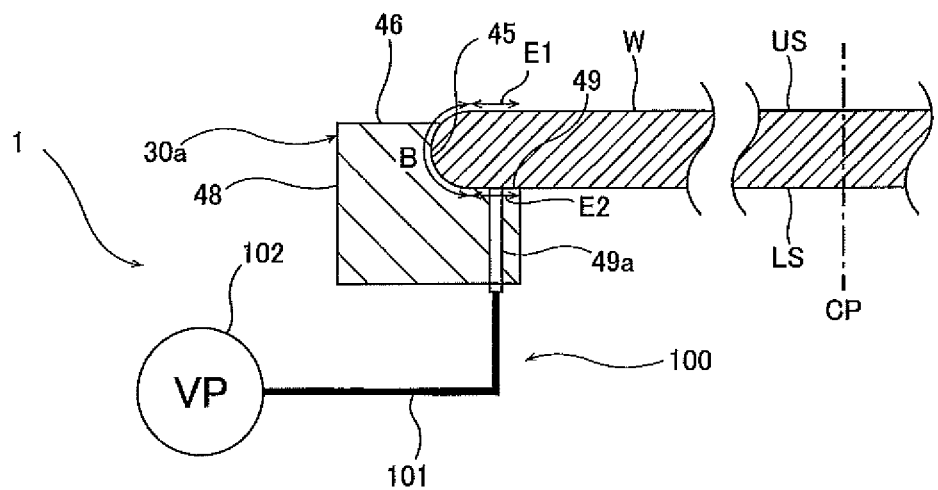
FIG. 18 is a view showing a substrate suction mechanism configured to suck and hold the wafer.
Figure 19:
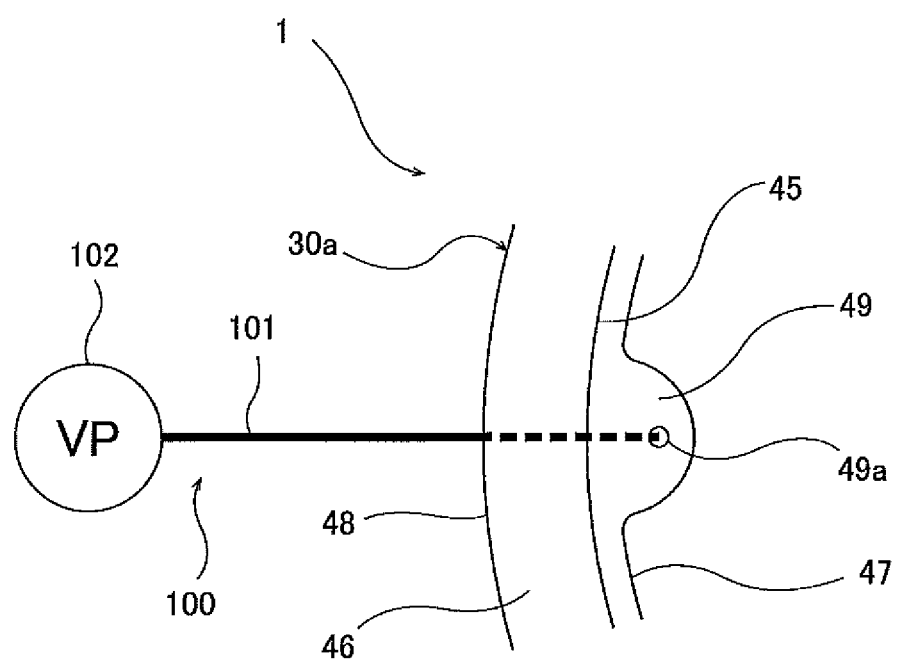
FIG. 19 is a view of a part of the chuck member of FIG. 18 as viewed from above.

FIG. 18 is a view showing a substrate suction mechanism 100 configured to suck and hold the wafer W. FIG. 19 is a view of a part of the chuck member 30a of FIG. 18 as viewed from above. As shown in FIG. 18, the substrate holding apparatus 1 includes the substrate suction mechanism 100 configured to suck and hold the wafer W, more specifically, the bottom edge portion E2 of the wafer W (see FIG. 1).

As shown in FIGS. 18 and 19, the chuck member 30a further has a flat portion 49 connected to the contact surface 45 and the inner curved surface 47. The flat portion 49 is a portion extending in the horizontal direction, i.e., parallel to the wafer W. In this embodiment, one flat portion 49 is illustrated, but a plurality of flat portions 49 may be provided. The flat portions 49 are arranged at equal intervals along the circumferential direction of the wafer W.

The flat portion 49 protrudes from the inner curved surface 47 toward the central axis CP of the wafer W. A suction hole 49a extending perpendicular to the wafer W is formed in the flat portion 49. This suction hole 49a is a through hole. The number of suction holes 49a may correspond to the number of flat portions 49. The substrate suction mechanism 100 includes a suction line 101 connected to the suction hole 49a and a suction device 102 connected to the suction line 101.

The number of suction lines 101 corresponds to the number of suction holes 49a. In an embodiment, in a case where the suction lines 101 are provided, the suction lines 101 may be connected to a single suction device 102. In another embodiment, the number of suction devices 102 corresponding to the number of suction lines 101 may be provided.

When the suction device 102 is driven while the holding chuck 30 holds the wafer W, the lower surface LS (more specifically, the bottom edge portion E2) of the wafer W is sucked and held through the suction line 101 and the suction hole 49a. In the embodiment shown in FIGS. 18 and 19, since both the holding chuck 30 and the substrate suction mechanism 100 can hold the wafer W, the wafer W can be more reliably held. Therefore, the jumping out of the wafer W from the holding chuck 30 is more reliably prevented.

The wafer W may be held by the holding chuck 30 so that the back surface (i.e., the surface on which the device is not formed) faces upward and the front surface (i.e., the surface on which the device is formed) faces downward. In this case, the holding chuck 30 needs to hold the wafer W so that the flat portion 49 of each chuck member 30a is not brought into contact with the device.

The wafer W may be held by holding chuck 30 so that the front surface (i.e., the surface on which the device is formed) faces upward and the back surface (i.e., the surface on which the device is not formed) faces downward depending on a processing purpose such as a cleaning process. In this case, the surface on which the device is formed faces upward. When the holding chuck 30 holds the wafer W, the flat portion 49 of each chuck member 30a is not brought into contact with the device.

Although not shown in the drawings, a friction sheet made of a non-slip material such as a rubber sheet may be attached on the flat portion 49. The friction sheet and the substrate suction mechanism 100 may be combined according to a rotational speed of the wafer W. Either one of the friction sheet and the substrate suction mechanism 100 may be selected. The combination of the friction sheet and the substrate suction mechanism 100 can more reliably prevent the wafer W from jumping out of the holding chuck 30.

When the scrubber 50 scrubs the wafer W, the foreign matters removed from the upper surface US of the wafer W may attach to the contact surface 45 of the holding chuck 30. In this manner, the foreign matters attached to the contact surface 45 may adversely affect the wafer W. Therefore, in an embodiment, the liquid supply nozzle 27 (see FIG. 2) may inject the cleaning liquid such as pure water toward the contact surface 45 of the holding chuck 30.

Figure 20:
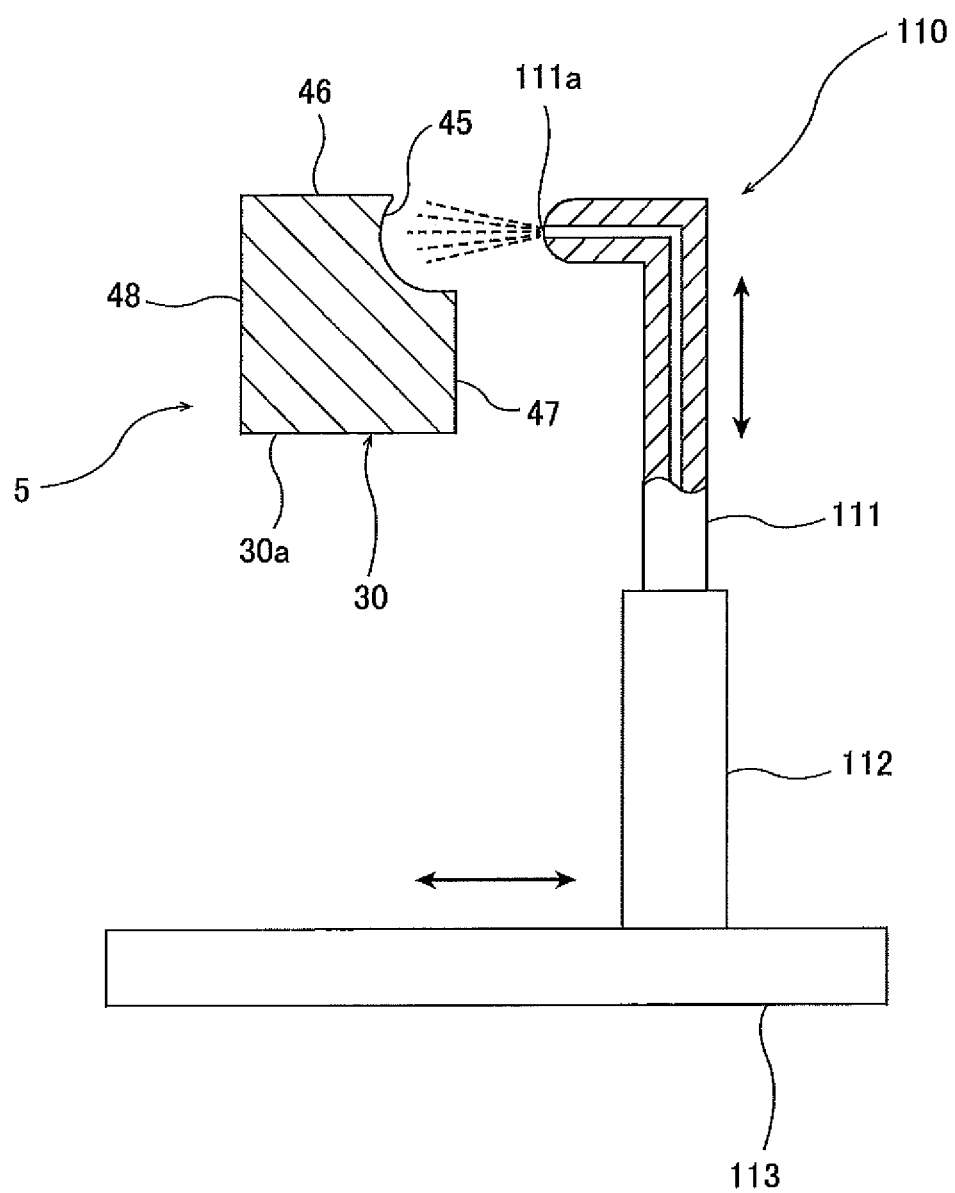
FIG. 20 is a view showing a cleaning mechanism.

In another embodiment, the substrate holding apparatus 1 may include a cleaning mechanism 110 configured to clean the contact surface 45 of the holding chuck 30 which can make contact with the wafer W. FIG. 20 is a view showing the cleaning mechanism 110. As shown in FIG. 20, the cleaning mechanism 110 includes an injection nozzle 111 configured to inject the cleaning liquid such as pure water, an elevating device 112 configured to elevate and lower the injection nozzle 111, and a horizontal moving device (or a slider) 113 configured to move horizontally the injection nozzle 111 together with the elevating device 112. The injection nozzle 111 extends in the vertical direction and has a shape bent toward the contact surface 45 of the holding chuck 30 in the middle of the injection nozzle 111. The horizontal moving device 113 is mounted on the fixed base 19.

An example of the elevating device 112 can include an air cylinder. An example of the horizontal moving device 113 can include a slide table. An injection port 111a of the injection nozzle 111 can be close to and away from the contact surface 45 by a combination of operations of the elevating device 112 and the horizontal moving device 114.

After terminating the scrubbing process of the wafer W, the wafer W is taken out from the substrate processing apparatus by a transfer machine (not shown). After taking out the wafer W, the controller 200 operates the elevating device 112 and the horizontal moving device 113 so that the injection port 111a of the injection nozzle 111 faces the contact surface 45. Thereafter, the injection nozzle 111 injects the cleaning liquid toward the contact surface 45 of the holding chuck 30 to clean the contact surface 45. At this time, the controller 200 may operate the substrate rotating mechanism 10 to rotate the holding chuck 30.

Figure 21:
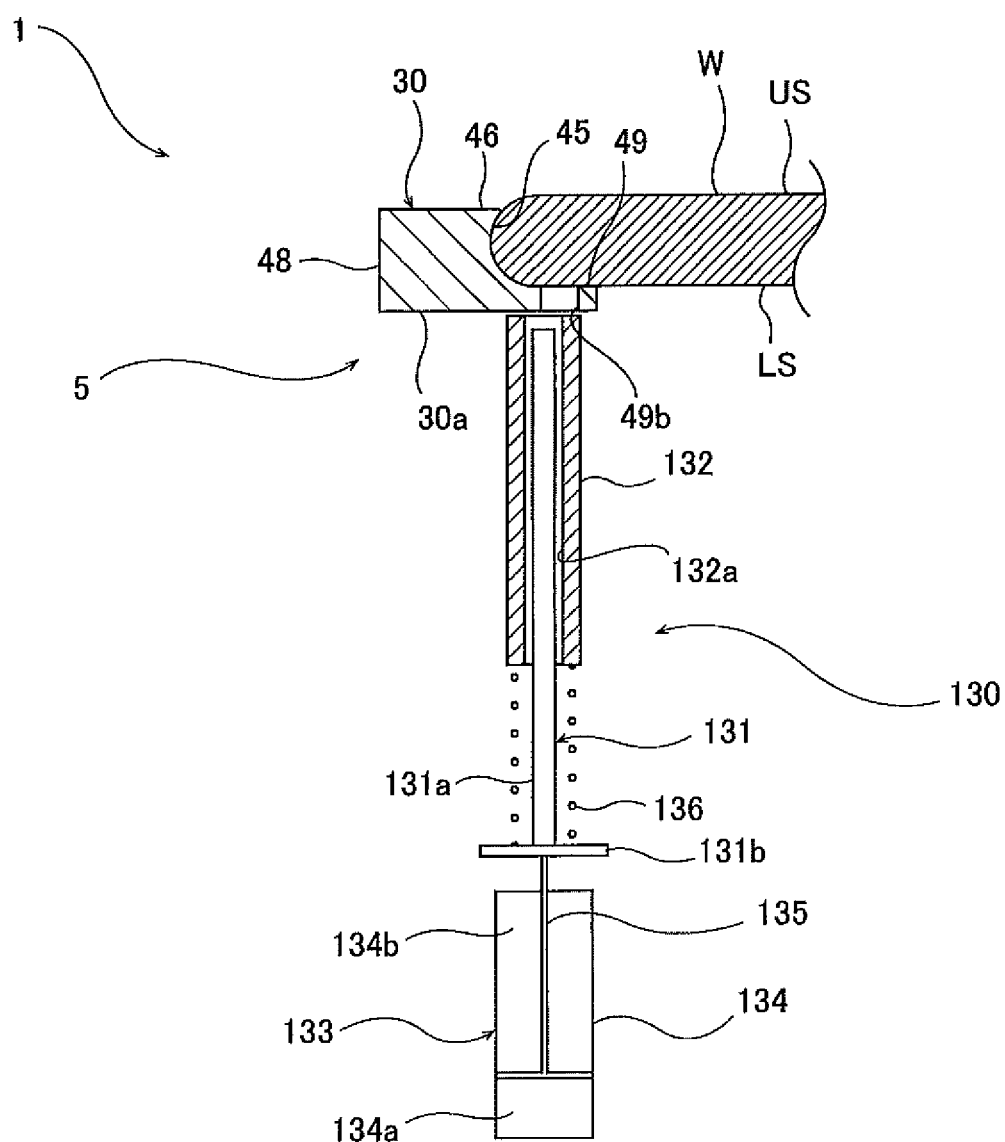
FIG. 21 is a view showing a substrate push-up mechanism configured to push up the wafer to above the substrate holder.
Figure 22:
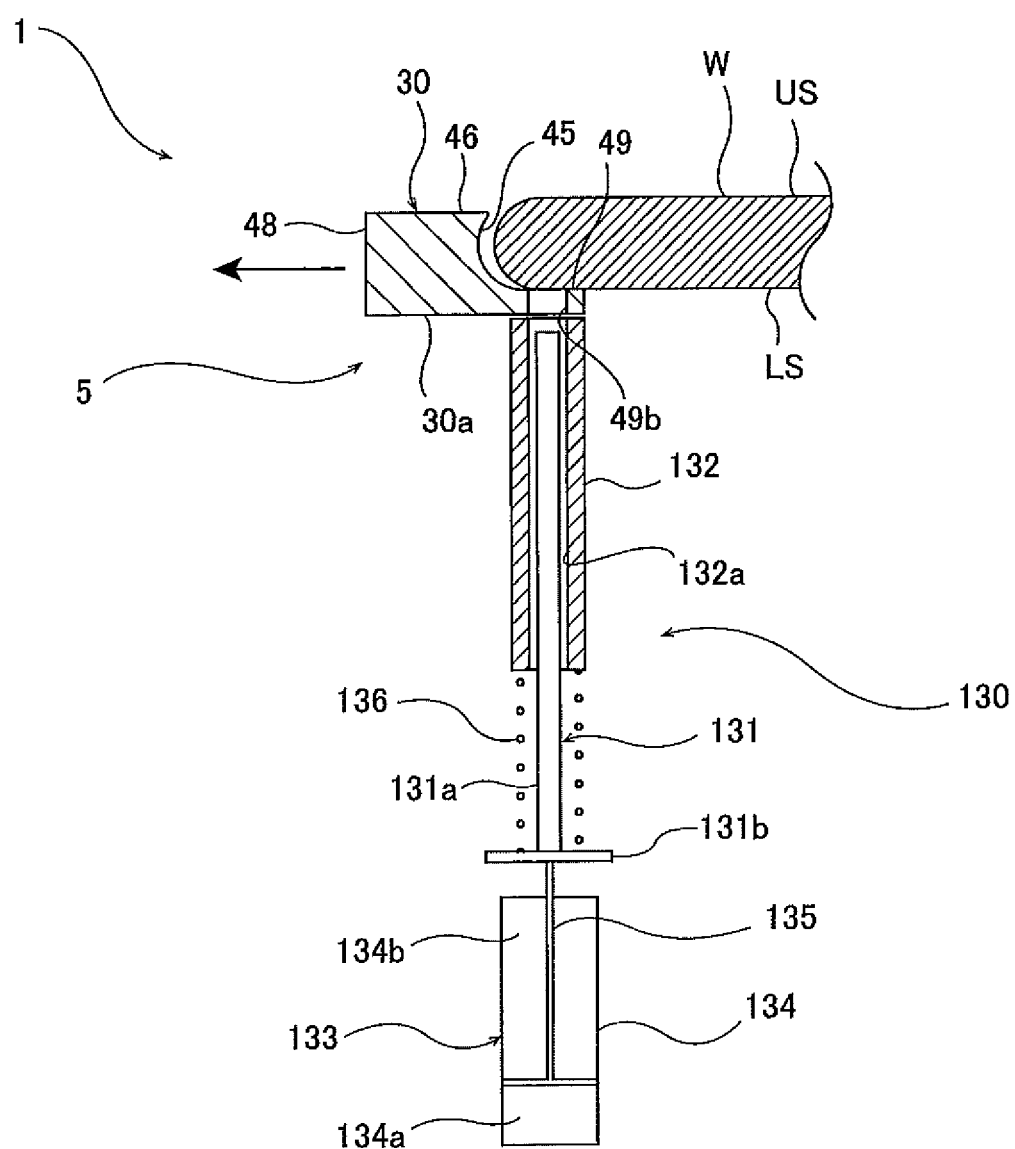
FIG. 22 is a view showing the substrate push-up mechanism configured to push up the wafer to above the substrate holder.
Figure 23:
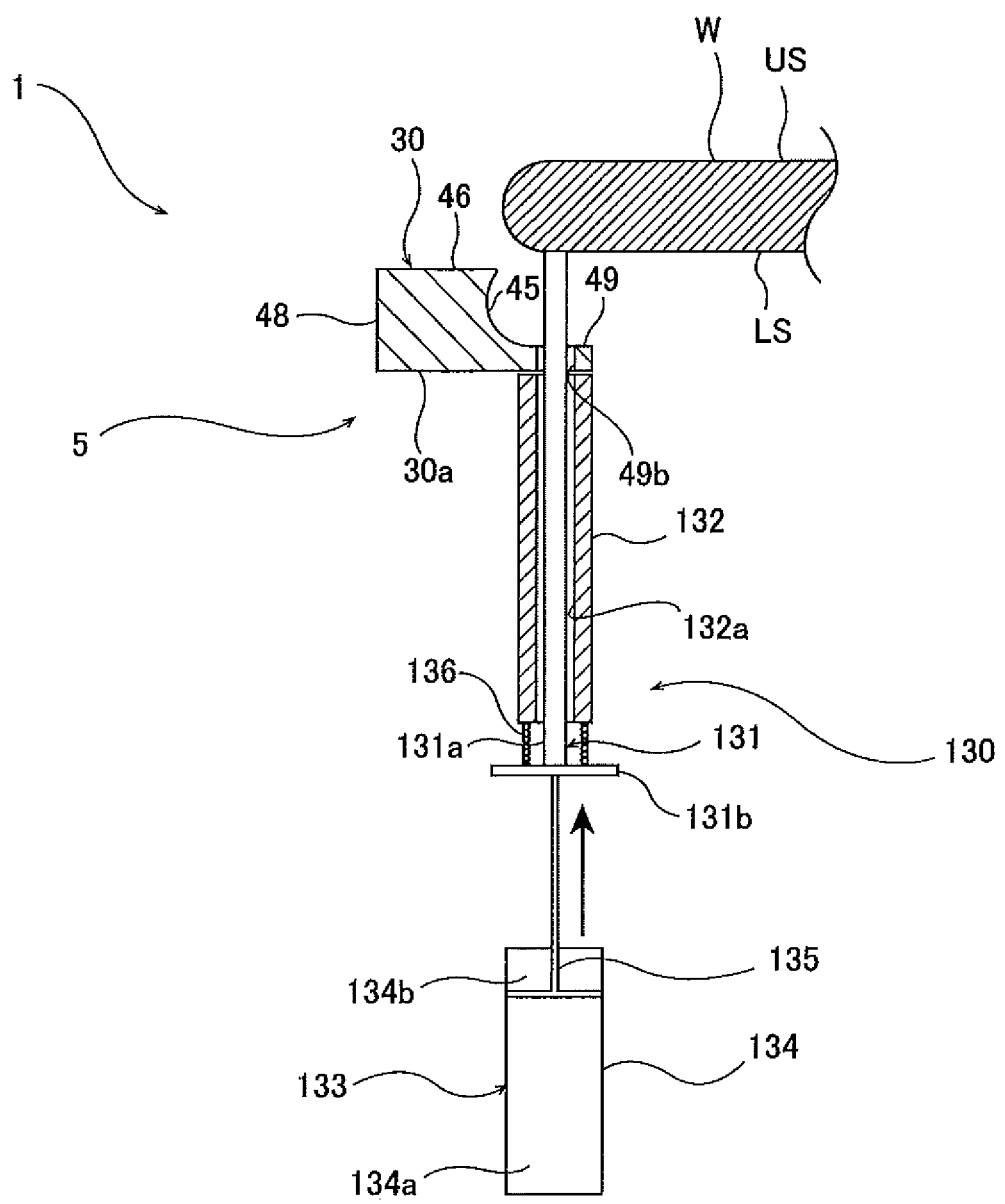
FIG. 23 is a view showing the substrate push-up mechanism configured to push up the wafer to above the substrate holder.

FIG. 21 to FIG. 23 are views showing a substrate push-up mechanism 130 configured to push up the wafer W to above the substrate holder 5. A cross section shape of the chuck member 30a in the embodiment shown in FIG. 21 to FIG. 23 is different from a cross section shape of the chuck member 30a in the above-described embodiment. However, they may be the same.

The substrate holding apparatus 1 includes the substrate push-up mechanism 130 disposed below the holding chuck 30 and in an inner space of the holder support member 11. After terminating the scrubbing process of the wafer W, the transfer machine takes out the wafer W from the substrate processing apparatus to transfer the wafer W while holding the wafer W. The substrate push-up mechanism 130 is a mechanism for pushing up the wafer W to above the holding chuck 30 to facilitate holding of the wafer W by the transfer machine.

The substrate push-up mechanism 130 includes a pusher pin 131 which is brought into contact with the lower surface LS of the wafer W to push up the wafer W, a hollow cylindrical member 132 which is disposed below the chuck member 30a and stores the pusher pin 131, a push-up device 133 configured to push up the pusher pin 131, and a push-down member 136 configured to push down the pusher pin 131.

The pusher pin 131 includes a rod body 131a extending vertically, i.e., perpendicular to the wafer W, and a support body 131b which is fixed to a lower end of the rod body 131a and supports the push-down member 136. The rod body 131a has a length capable of pushing up the lower surface LS of the wafer W to a position higher than the upper surface 46 of the chuck member 30a. The cylindrical member 132 has an insertion hole 132a formed therein. The rod body 131a is inserted in the insertion hole 132a.

The cylindrical member 132 is disposed adjacent to the lower surface of the chuck member 30a, and is not in contact with the chuck member 30a. Therefore, if the chuck member 30a moves horizontally by the pusher 32 and the releaser 34, the substrate push-up mechanism 130 does not move together with the chuck member 30a. The push-up device 133 of the substrate push-up mechanism 130 may be fixed to the above-described fixed base 19 (see FIG. 2). The cylindrical member 132 is disposed separately from the holder support member 11, and is not rotated together with the holder support member 11. The cylindrical member 132 may be fixed a fixing element (not shown) for fixing the cylindrical member 132.

In this embodiment, the chuck member 30a has a flat portion 49. A communication portion 49b which is communicable with the insertion hole 132a of the cylindrical member 132 is formed in the flat portion 49. The communication portion 49b is a communication hole having a size that the rod body 131a can penetrate therethrough. The rod body 131a accesses the lower surface LS of the wafer W through the insertion hole 132a and the communication portion 49b.

Figure 24:
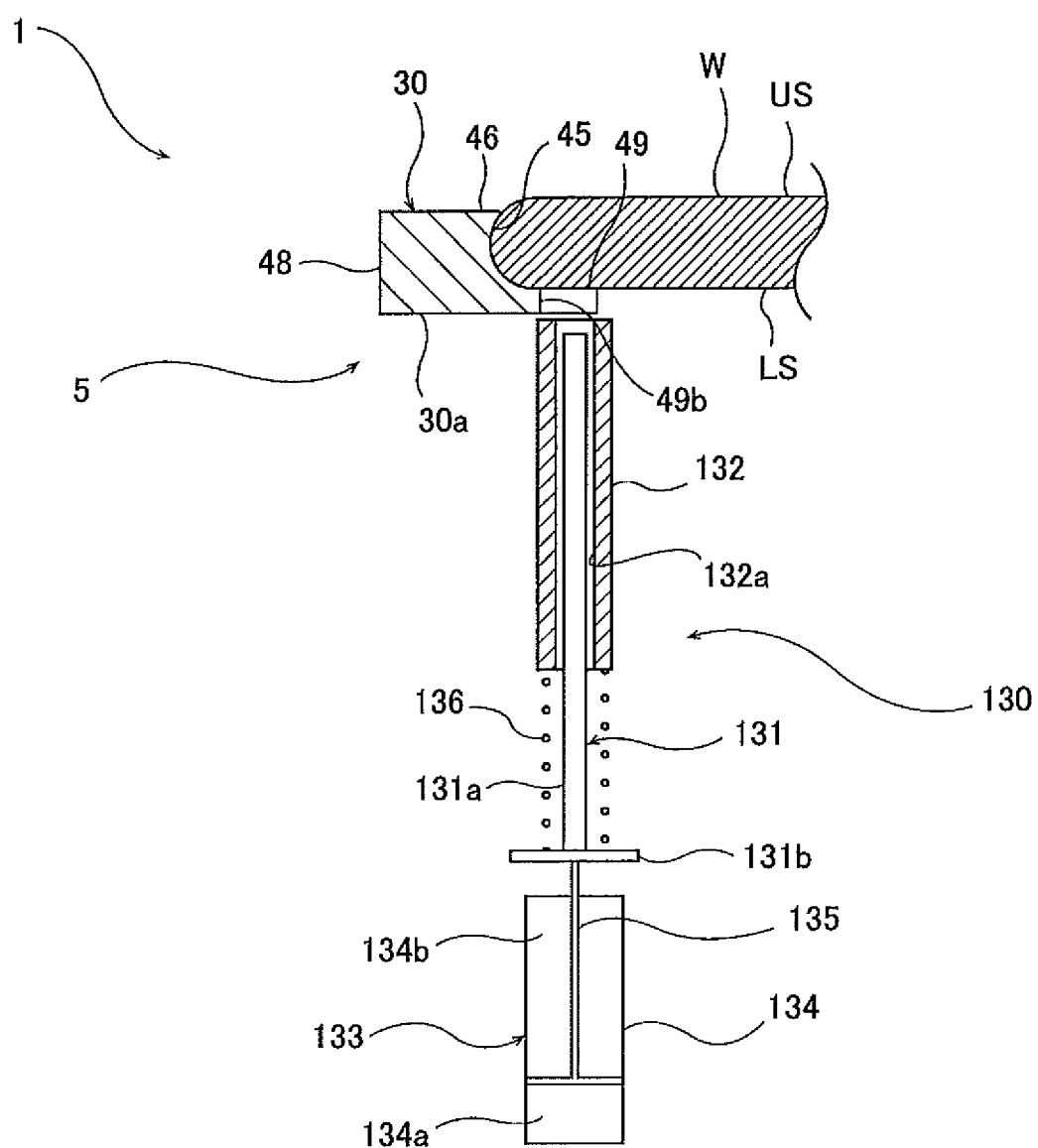
FIG. 24 is a view showing another embodiment of a communication portion.

FIG. 24 is a view showing another embodiment of the communication portion 49b. As shown in FIG. 24, the communication portion 49b may be a notch extending toward the outer curved surface 48.

In this embodiment, the push-up device 133 is an air cylinder which includes a cylinder body 134 and a piston rod 135. An internal space of the cylinder body 134 is divided into a first pressure chamber 134a and a second pressure chamber 134b by the piston rod 135. Two gas delivery lines (not shown) are connected to the cylinder body 134. The gas delivery line is connected to a gas supply source (not shown).

The piston rod 135 is fixed to the pusher pin 131. Therefore, the pusher pin 131 is elevated with elevating the piston rod 135, and lowered with lowering the piston rod 135. In an embodiment, piston rod 135 and the pusher pin 131 may be integrally composed.

In this embodiment, the push-down member 136 is a vertical coil spring (biasing member) arranged in the vertical direction. The rod body 131a of the pusher pin 131 penetrates the push-down member 136, and the push-down member 136 is disposed between a lower end of the cylindrical member 132 and the support body 131b fixed to the lower end of the rod body 131a.

After terminating the scrubbing process of the wafer W, the controller 200 controls the operation of the rotating device 12 so that the communication portion 49b of the chuck member 30a stops at a predetermined position. The predetermined position is a position that the communication portion 49b of the chuck member 30a and the insertion hole 132a of the cylindrical member 132 communicate with each other when the releaser 34 (see FIG. 9) moves the chuck member 30a away from the wafer W.

As shown in FIG. 22, when the releaser 34 moves the chuck member 30a, a gap is formed between the contact surface 45 of the chuck member 30a and the outermost circumferential surface of the wafer W. With such a movement of the chuck member 30a, the communication portion 49b of the chuck member 30a communicates with the insertion hole 132a of the cylindrical member 132, and the pusher pin 131 can access the wafer W through the insertion hole 132a and the communication portion 49b.

In this state, when the compressed gas is supplied to the first pressure chamber 134a through the gas delivery line, the piston rod 135 and the pusher pin 131 are brought into contact with the lower surface LS of the wafer W through the insertion hole 132a and the communication portion 49b. The pusher pin 131 pushes up the wafer W until the lower surface LS of the wafer W is located above the upper surface 46 of the chuck member 30a (see FIG. 23). Thereafter, the transfer machine holds and transfers the wafer W. After transferring the wafer W, the push-down member 136 biases the support body 131b downward. The pusher pin 131 is lowered until a tip of the pusher pin 131 is located below the communication portion 49b.

In the embodiment shown in FIG. 21 to FIG. 24, a single substrate push-up mechanism 130 is illustrated. However, the substrate holding apparatus 1 includes a plurality of substrate push-up mechanisms 130. The substrate push-up mechanisms 130 are arranged at equal intervals along the circumferential direction of the holding chuck 30, and an elevating operation of the pusher pins 131 is simultaneously performed by the controller 200.

In an embodiment, the substrate push-up mechanism 130 (more specifically, the cylindrical member 132) may be fixed to the lower surface of the chuck member 30a. In this embodiment, the substrate push-up mechanism 130 is rotated together with the holding chuck 30. The cylindrical member 132 is fixed to the lower surface of the chuck member 30a so that the insertion hole 132a of the cylindrical member 132 communicates with the communication portion 49b of the chuck member 30a. The rod body 131a of the pusher pin 131 can access the wafer W through the insertion hole 132a and the communication portion 49b.

Figure 25:
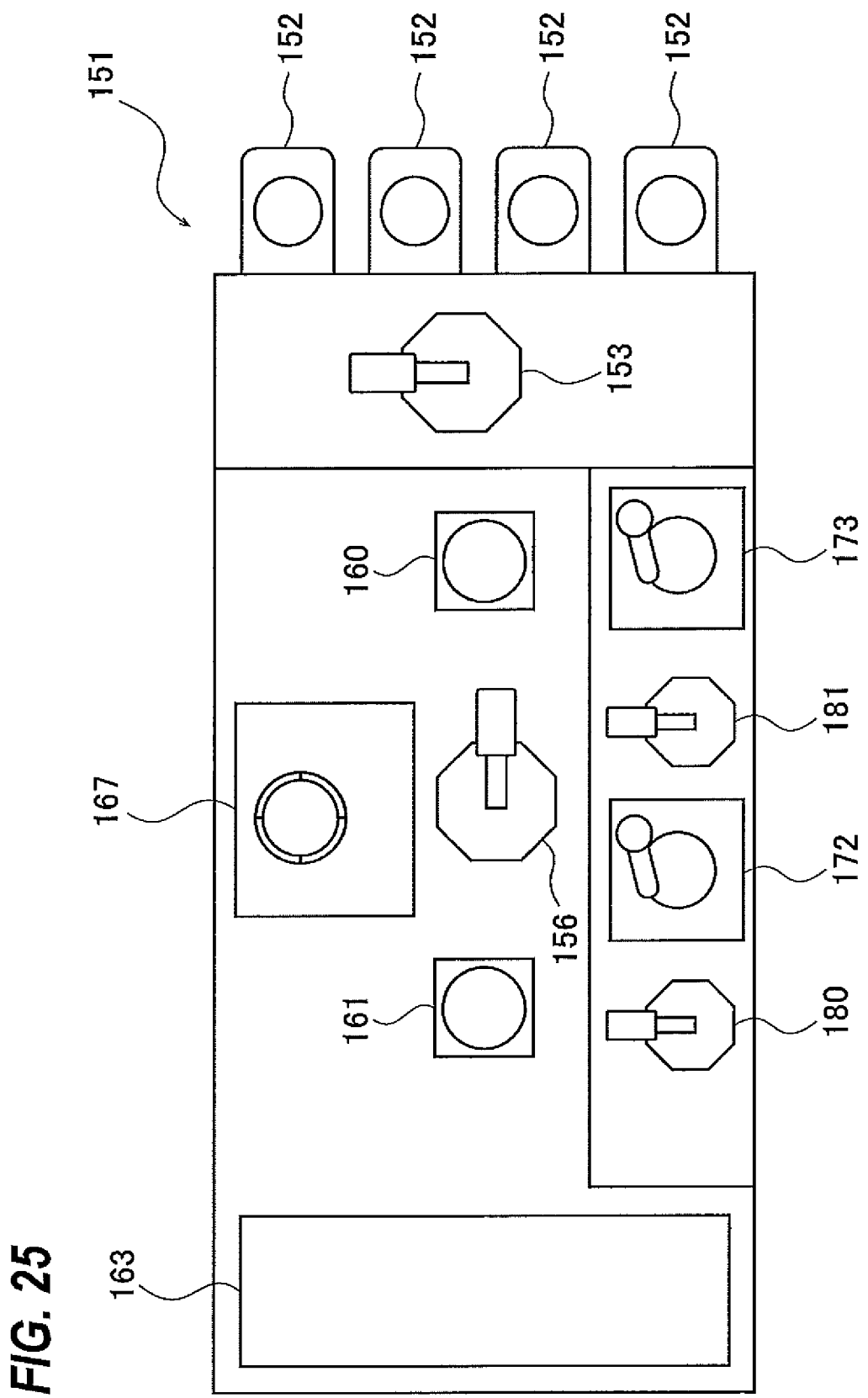
FIG. 25 is a plan view schematically showing an embodiment of a substrate processing system including the substrate processing apparatus (i.e., polishing apparatus)

FIG. 25 is a plan view schematically showing an embodiment of a substrate processing system including the above-described substrate processing apparatus (i.e., polishing apparatus). In this embodiment, the substrate processing system has a loading and unloading section 151 including a plurality of load ports 152 on which a wafer cassette (substrate cassette) storing a number of wafers therein. An open cassette, an SMIF (Standard Manufacturing Interface) pod, or a FOUP (Front Opening Unified Pod) can be mounted on the load port 152. The SMIF and the FOUP are a hermetically sealed container which houses a wafer cassette therein and covers it with a partition wall to thereby provide interior environments isolated from an external space.

The loading and unloading section 151 includes a first transfer robot (loader) 153 movable along an arrangement direction of the load ports 152. The first transfer robot 153 can selectively access the wafer cassettes installed on the load port 152 and can remove the wafer from the wafer cassettes.

The substrate processing system further includes a second transfer robot 156 which is movable in the horizontal direction, a first temporary placement stage 160 on which a wafer is temporarily placed, a second temporary placement stage 161 on which a wafer is temporarily placed, a polishing unit 167, a system controller 163 configured to control overall operations of the substrate processing system, a cleaning unit 172 configured to clean a polished wafer, and a drying unit 173 configured to dry a cleaned wafer. A third transfer robot 180 for transferring a wafer is disposed between the second temporary placement stage 161 and the cleaning unit 172, and a fourth transfer robot 181 for transferring a wafer is disposed between the cleaning unit 172 and the drying unit 173. The polishing unit 167 has the same configuration as the above-described substrate processing apparatus. In the embodiment shown in FIG. 25, the polishing unit 167 is a polishing apparatus.

A description will now be given of a transfer route for a wafer during a polishing process in which the wafer is polished in the polishing unit 167. A number of (e.g., 25) wafers are housed, with their device surfaces facing upward, in a wafer cassette (substrate cassette) set in a load port 152. The first transfer robot 153 takes a wafer out of the wafer cassette, and places the wafer on the first temporary placement stage 160.

The second transfer robot 156 takes the wafer out of the first temporary placement stage 160, and transfers the wafer, with its back surface facing downward, to the polishing unit 167. The back surface of the wafer is polished in the polishing unit 167 in the above-described manner. The second transfer robot 156 takes the polished wafer out of the polishing unit 167, and places the wafer on the second temporary placement stage 161. The third transfer robot 180 takes the wafer out of the second temporary placement stage 161, and transfers the wafer to the cleaning unit 172.

The wafer is transferred to the cleaning unit 172 by the second transfer robot 156. The second transfer robot 156 corresponds to the transfer machine described in the above embodiment. The wafer is cleaned by the cleaning unit 172 with its surface (i.e., the surface on which the device is formed) facing upward. The cleaning unit 172 may include the substrate holding apparatus 1 described in the above embodiment.

Figure 26:
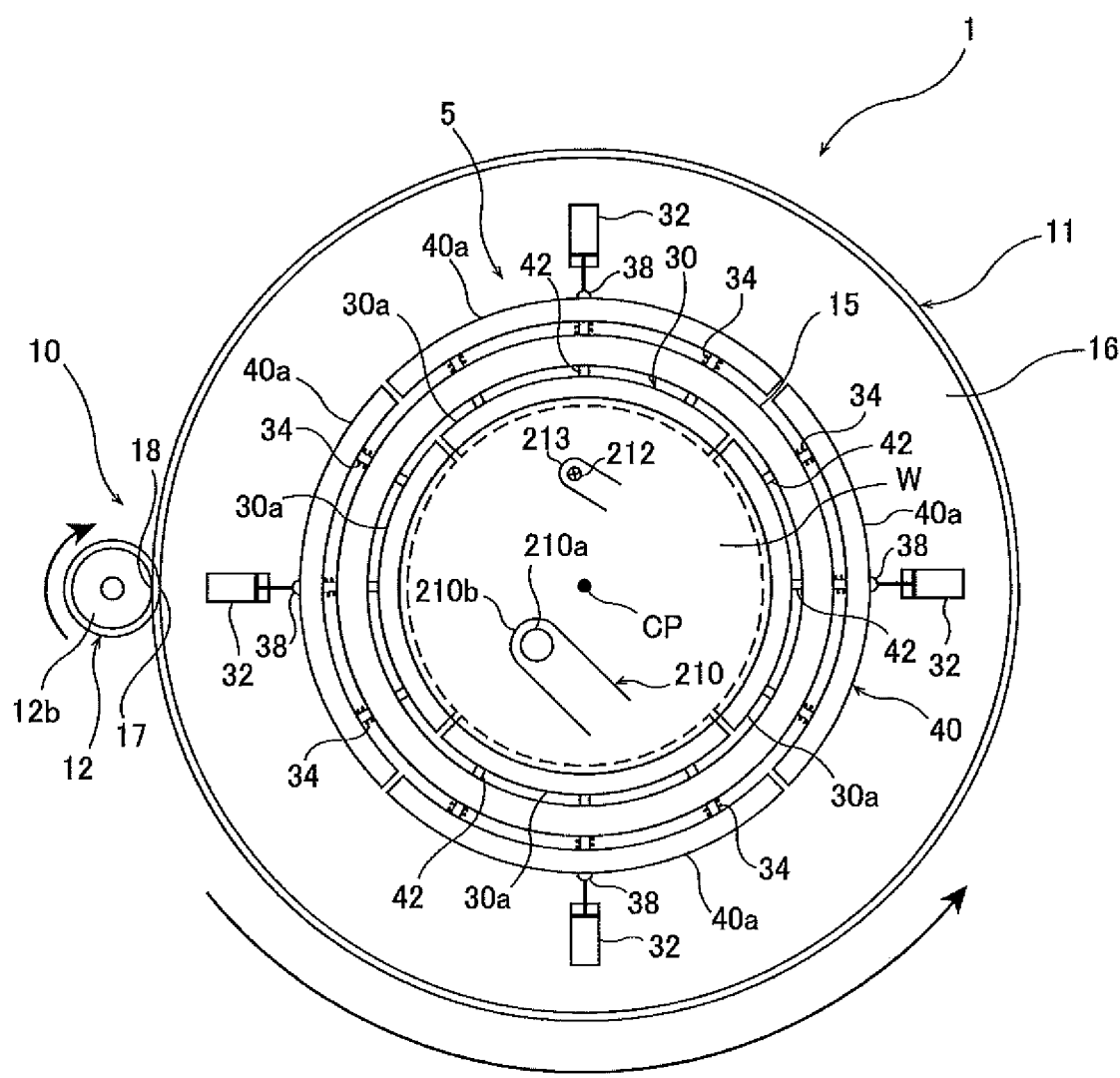
FIG. 26 is a view showing an embodiment of a cleaning unit.

FIG. 26 is a view showing an embodiment of the cleaning unit 172. With reference to the construction and the operation of this embodiment which are the same as those of the above-described embodiment, a duplicate description thereof will be omitted. For example, the cleaning unit 172 is a pencil cleaning unit. The cleaning unit 172 includes the substrate holding apparatus 1 described in the above embodiment, a pencil cleaning member 210 configured to clean the upper surface US of the wafer W, and a two-fluid jet nozzle 212 configured to inject two fluids onto the upper surface US of the wafer W. In the cleaning unit 172, the pencil cleaning member 210 corresponds to the scrubber 50 described in the above embodiment.

The pencil cleaning member 210 includes a pen sponge 210a configured to be contactable with the upper surface US of the wafer W, and an arm 210b configured to hold the pen sponge 210a. The arm 210b is configured to pivot in a plane parallel to the wafer W. The pen sponge 210a moves in the radial direction of the wafer W by swinging the arm 210b, and is brought into contact with the upper surface US (i.e., the surface on which the device is formed) of the wafer W.

In this embodiment, the substrate holder 5 is disposed below the upper surface US of the wafer W in a state where the wafer is held by the substrate holder 5. Therefore, the pen sponge 200a can clean the entire upper surface US of the wafer W without contacting the substrate holder 5. As a result, the pencil cleaning member 210 can remove the foreign matters even when the foreign matters attach to the entire upper surface US of the wafer.

The two-fluid jet nozzle 212 is attached to a cleaning arm 213 and moves together with the cleaning arm 213 above the wafer W. A liquid and a gas are supplied to the two-fluid jet nozzle 212, and a fluid mixture of a liquid and a gas is injected from the two-fluid jet nozzle 212 onto the upper surface of the wafer W. In this manner, in this embodiment, the cleaning unit 172 includes the pencil cleaning member 210 and the two-fluid jet nozzle 200.

In an embodiment, the substrate processing apparatus (see FIG. 2) according to the above-described embodiment may include the pencil cleaning member 210. In this case, the controller 200 switches an operation of the pencil cleaning member 210 from a wafer cleaning operation for cleaning the wafer W to a chuck cleaning operation for cleaning the contact surface 45 of the chuck member 30a. The contact surface 45 is located lower than the upper surface US of the wafer W. The pencil cleaning member 210 may be designed so that a position of the pen sponge 210a when the pen sponge 210a is lowered the most is a cleaning position of the contact surface 45. The controller 200 may inject the liquid from the liquid supply nozzle 27 together with the chuck cleaning operation by the pencil cleaning member 210.

As shown in FIG. 25, the fourth transfer robot 181 takes out the cleaned wafer from the cleaning unit 172 and transfers the cleaned wafer to the drying unit 173. The wafer is dried by the drying unit 173. In an embodiment, the drying unit 173 may be configured to spin dry the wafer by rotating the wafer at a high speed around the central axis of the wafer. In another embodiment, the drying unit 173 may be an IPA type for drying the wafer by supplying pure water and an IPA vapor (a mixture of isopropyl alcohol and $N_2$ gas) from a pure-water nozzle and an IPA nozzle while moving the pure-water nozzle and the IPA nozzle in the radial direction of the wafer.

The drying unit 173 also includes the substrate holding apparatus 1 described in the above embodiment as with the cleaning unit 172. Therefore, the substrate holder 5 is disposed below the upper surface of the wafer W. With such a configuration, in a drying process of the wafer W, the liquid repelled from the wafer passes above the chuck member 30a without contacting the chuck member 30a. Therefore, the liquid does not enter between the contact surface 45 of the chuck member 30a and the outermost circumferential surface of the wafer W.

A dried wafer is returned to the wafer cassette of the load port 152 by the first transfer robot 153. In this manner, the substrate processing system can perform a series of steps of polishing, cleaning, drying the wafer, and transferring the wafer to the loading and unloading section.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus comprising:
a substrate holding apparatus; and
a processing head configured to scrub an upper surface of a substrate,
the substrate holding apparatus comprises:
    a substrate holder configured to hold the substrate; and
    a substrate rotating mechanism configured to rotate the substrate held by the substrate holder,
wherein the substrate holder is disposed below the upper surface of the substrate so as not to project above the upper surface of the substrate in a state where the substrate is held by the substrate holder,
wherein the substrate holder comprises:
    a holding chuck configured to hold an outermost circumferential surface of the substrate;
    a pusher configured to move the holding chuck in a direction toward the substrate;
    a releaser configured to move the holding chuck in a direction away from the substrate;
    a biasing force receiving portion having a contact surface with the pusher, the biasing force receiving portion being configured to receive a biasing force of the pusher and a biasing force of the releaser; and
    a coupling member configured to couple to the biasing force receiving portion and the holding chuck, the coupling member penetrating the releaser, and
    wherein the substrate rotating mechanism comprises a holder coupling portion on which the releaser is mounted.

2. The substrate processing apparatus according to claim 1, wherein the substrate holder comprises a holding chuck configured to hold an outermost circumferential surface of the substrate, and
the holding chuck comprises a plurality of chuck members arranged at equal intervals around a rotation center of the substrate rotating mechanism.

3. The substrate processing apparatus according to claim 2, wherein the substrate holding apparatus comprises a cleaning mechanism configured to clean a contact surface of the holding chuck which can make contact with the substrate.

4. The substrate processing apparatus according to claim 2, wherein the substrate holder comprises:
    a pusher configured to move the holding chuck in a direction toward the substrate; and
    a releaser configured to move the holding chuck in a direction away from the substrate.

5. The substrate processing apparatus according to claim 1, wherein the substrate holding apparatus comprises a substrate suction mechanism configured to suck and hold the substrate.

6. The substrate processing apparatus according to claim 1, wherein the substrate holding apparatus comprises a substrate push-up mechanism configured to push up the substrate above the substrate holder.

7. The substrate processing apparatus according to claim 1, wherein the substrate rotating mechanism comprises:
a holder support member configured to support the substrate holder; and
a rotating device coupled to the holder support member, the rotating device being configured to rotate the holder support member about a central axis of the substrate.

8. The substrate processing apparatus according to claim 1, wherein the substrate processing apparatus comprises a rotating base extending radially outwardly of the holder coupling portion, the rotating base being fixed to a lower end of the holder coupling portion, and
wherein the rotating base extends parallel to a surface of the substrate, and is disposed concentrically with the substrate held by the substrate holder.

9. The substrate processing apparatus according to claim 1, wherein the substrate processing apparatus comprises a rotating base extending radially outwardly of the holder coupling portion, the rotating base being fixed to a lower end of the holder coupling portion,
wherein the substrate rotating mechanism comprises a rotating device being configured to rotate a holder support member about a central axis of the substrate, the holder support member supporting the substrate holder,
wherein the rotating device comprises:
a motor; and
a motor pulley connected to the motor, the motor pulley having a driving gear for rotating the holder support member, the driving gear being provided on an outer circumferential surface of the motor pulley,
wherein the rotating base has a driven gear meshed with the driving gear, the driven gear being provided on an outer circumferential surface of the rotating base, and
wherein the rotating base is configured to rotate together with the motor pulley by driving the motor in a state where the driving gear and the driven gear are meshed with each other.

10. The substrate processing apparatus according to claim 1, wherein the substrate processing apparatus comprises a rotating base extending radially outwardly of the holder coupling portion, the rotating base being fixed to a lower end of the holder coupling portion,
wherein the substrate rotating mechanism comprises a rotating device being configured to rotate a holder support member about a central axis of the substrate, the holder support member supporting the substrate holder,
wherein the rotating device comprises:
a motor;
a motor pulley connected to the motor; and
a timing belt is stretched between the motor pulley and the rotating base; and
wherein the rotating base is configured to rotate together with the motor pulley by driving the motor through the timing belt.

11. The substrate processing apparatus according to claim 1, wherein the pusher comprises:
an air cylinder; and
a wide shaped head fixed to a tip of a piston rod, and wherein the head comprises a plurality of pressing balls extending from an inner curved surface of the head toward an outer curved surface of the biasing force receiving portion.

12. The substrate processing apparatus according to claim 1, wherein the pusher comprises:
an air cylinder; and
a wide shaped head fixed to a tip of a piston rod, the head comprising a first magnet mounted inside the head, and
wherein the biasing force receiving portion has the same number of second magnets as the first magnet,
wherein the first magnet and the second magnet are disposed so that the same magnetic poles face each other.

13. A substrate holding apparatus comprising:
a substrate holder configured to hold a substrate; and
a substrate rotating mechanism configured to rotate the substrate held by the substrate holder,
wherein the substrate holder is disposed below an upper surface of the substrate so as not to project above the upper surface of the substrate in a state where the substrate is held by the substrate holder,
wherein the substrate holder comprises:
a holding chuck configured to hold an outermost circumferential surface of the substrate;
a pusher configured to move the holding chuck in a direction toward the substrate;
a releaser configured to move the holding chuck in a direction away from the substrate;
a biasing force receiving portion having a contact surface with the pusher, the biasing force receiving portion being configured to receive a biasing force of the pusher and a biasing force of the releaser; and
a coupling member configured to couple to the biasing force receiving portion and the holding chuck, the coupling member penetrating the releaser, and
wherein the substrate rotating mechanism comprises a holder coupling portion on which the releaser is mounted.

14. The substrate holding apparatus according to claim 13, wherein the substrate holder comprises a holding chuck configured to hold an outermost circumferential surface of the substrate, and
the holding chuck comprises a plurality of chuck members arranged at equal intervals around a rotation center of the substrate rotating mechanism.

15. The substrate holding apparatus according to claim 14, wherein the substrate holding apparatus comprises a cleaning mechanism configured to clean a contact surface of the holding chuck which can make contact with the substrate.

16. The substrate holding apparatus according to claim 14, wherein the substrate holder comprises:
a pusher configured to move the holding chuck in a direction toward the substrate; and
a releaser configured to move the holding chuck in a direction away from the substrate.

17. The substrate holding apparatus according to claim 13, wherein the substrate holding apparatus comprises a substrate suction mechanism configured to suck and hold the substrate.

18. The substrate holding apparatus according to claim 13, wherein the substrate holding apparatus comprises a substrate push-up mechanism configured to push up the substrate above the substrate holder.

19. The substrate holding apparatus according to claim 13, wherein the substrate rotating mechanism comprises:

a holder support member configured to support the substrate holder; and a rotating device coupled to the holder support member, the rotating device being configured to rotate the holder support member about a central axis of the substrate.

* * * * *